United States Patent
Yamaguchi

(10) Patent No.: US 11,289,510 B2
(45) Date of Patent: Mar. 29, 2022

(54) SEMICONDUCTOR DEVICE INCLUDING FERROELECTRIC FILM AND METHOD OF MANUFACTURING THE SAME

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/911,811

(22) Filed: Jun. 25, 2020

(65) Prior Publication Data
US 2021/0028180 A1    Jan. 28, 2021

(30) Foreign Application Priority Data

Jul. 25, 2019   (JP) .............................. JP2019-136577

(51) Int. Cl.
| | |
|---|---|
| H01L 27/1159 | (2017.01) |
| H01L 29/51 | (2006.01) |
| H01L 27/11563 | (2017.01) |
| H01L 29/78 | (2006.01) |
| H01L 21/28 | (2006.01) |
| H01L 27/11585 | (2017.01) |
| H01L 29/40 | (2006.01) |

(52) U.S. Cl.
CPC .... *H01L 27/1159* (2013.01); *H01L 27/11563* (2013.01); *H01L 27/11585* (2013.01); *H01L 29/408* (2013.01); *H01L 29/40117* (2019.08); *H01L 29/516* (2013.01); *H01L 29/517* (2013.01); *H01L 29/78391* (2014.09)

(58) Field of Classification Search
CPC ......... H01L 27/11563; H01L 27/11585; H01L 27/1159; H01L 29/40111; H01L 29/40117; H01L 29/408; H01L 29/516; H01L 29/517; H01L 29/78391
See application file for complete search history.

(56) References Cited

U.S. PATENT DOCUMENTS

| | | | | |
|---|---|---|---|---|
| 6,737,716 B1* | 5/2004 | Matsuo | ............. | H01L 21/28185 257/406 |
| 10,121,875 B1* | 11/2018 | Ho | ...................... | H01L 21/3086 |
| 2002/0195643 A1* | 12/2002 | Harada | ............. | H01L 21/28202 257/310 |

(Continued)

*Primary Examiner* — Matthew E Warren
(74) *Attorney, Agent, or Firm* — McDermott Will & Emery LLP

(57) ABSTRACT

A first amorphous film including hafnium, oxygen and a first element is formed, and a plurality of grains including a second element which differs from any of hafnium, oxygen and the first element is formed on the first amorphous film. An insulating film including a third element that differs from any of hafnium and the second element is formed over the plurality of grains and the first amorphous film, thereby forming a plurality of grains including the second element and the third element. A second amorphous film including the same materials as those of the first amorphous film is formed on the plurality of grains and the first amorphous film. By performing heat treatment, the first amorphous film and the second amorphous film are crystallized to form a first ferroelectric film which is an orthorhombic and a second ferroelectric film which is an orthorhombic, respectively.

9 Claims, 21 Drawing Sheets

(56) References Cited

U.S. PATENT DOCUMENTS

| | | | |
|---|---|---|---|
| 2008/0029822 A1* | 2/2008 | Tsuchiya | H01L 29/517 257/369 |
| 2015/0340372 A1 | 11/2015 | Pandey et al. | |
| 2018/0240804 A1* | 8/2018 | Yoo | H01L 29/516 |
| 2019/0355584 A1* | 11/2019 | Yamaguchi | G11C 11/223 |

* cited by examiner

FIG. 3

| Applied Voltage / Operation | Vd | Vg | Vs | Vb |
|---|---|---|---|---|
| Write | 0V | −4V | 0V | 0V |
| Erase | 0V | 4V | 0V | 0V |
| Read | Vdd | 0V | 0V | 0V |

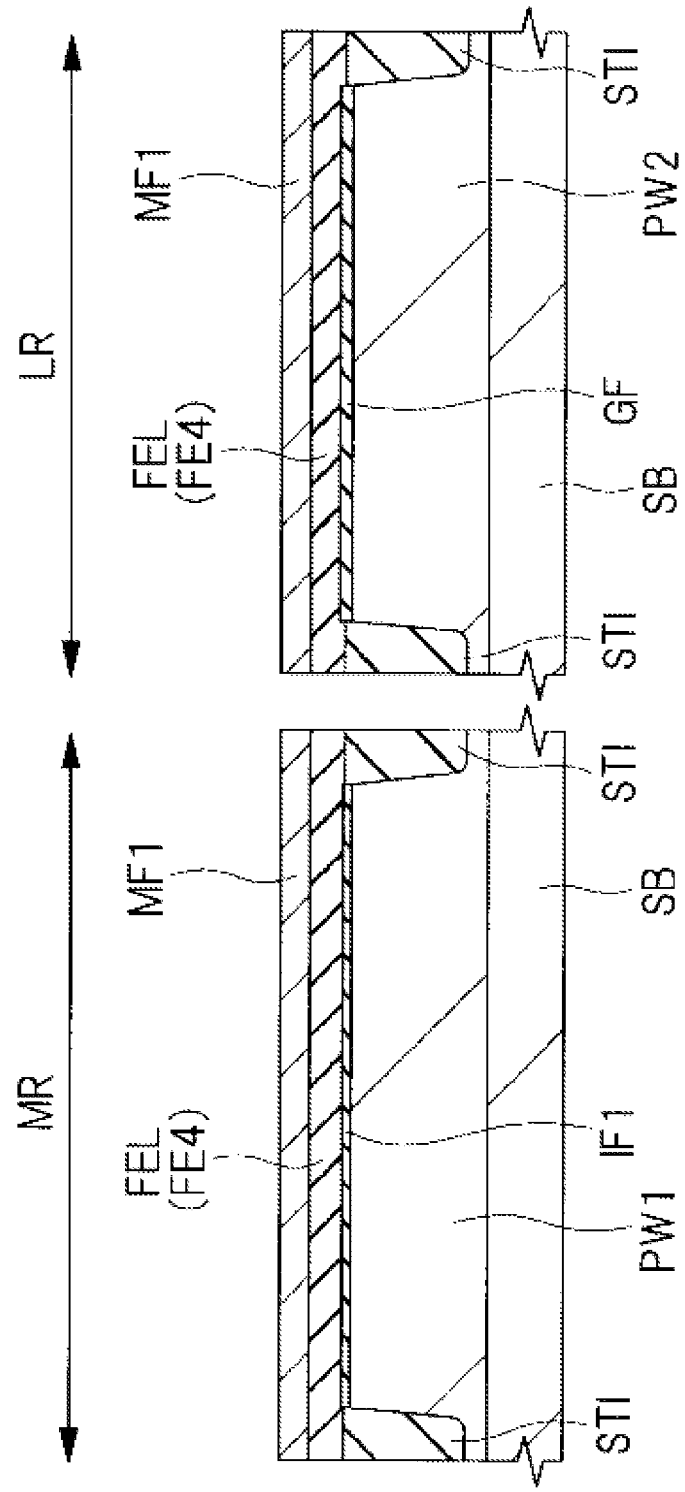

SEMICONDUCTOR DEVICE INCLUDING FERROELECTRIC FILM AND METHOD OF MANUFACTURING THE SAME

CROSS-REFERENCE TO RELATED APPLICATIONS

The disclosure of Japanese Patent Application No. 2019-136577 filed on Jul. 25, 2019 including the specification, drawings and abstract is incorporated herein by reference in its entirety.

BACKGROUND

The present invention relates to a semiconductor device and method of manufacturing the same, and more particularly, the present invention relates to a technique useful for a semiconductor device used as a memory device using a ferroelectric film and method of manufacturing the same.

In recent years, ferroelectric memory cells using ferroelectric layers have been developed as semiconductor memory devices operating at low voltage. Ferroelectric memory cells are nonvolatile memory cells that change write state and erase state of information by controlling the direction of polarization of the ferroelectric layer.

There are disclosed techniques listed below.
[Patent Document 1] U.S. Patent Application Publication No. 2015/0340372

Patent Document 1 discloses a nonvolatile memory cell constructed by a transistor having a ferroelectric layer made of ferroelectric crystalline material under the gate electrode.

SUMMARY

In ferroelectric memory cells using $HfO_2$ film constituting a ferroelectric layer, the crystal phase of $HfO_2$ film must be orthorhombic. However, the orthorhombic crystal phase is a metastable phase, and if an amorphous $HfO_2$ film is formed on a semiconductor substrate during the manufacturing process of a semiconductor device and then a heat treatment is performed at a high temperature of, for example, about 700 to 1000° C., for crystallization, the crystalline phase of $HfO_2$ film becomes monoclinic, and thus, $HfO_2$ film becomes paraelectric instead of ferroelectric. In ferroelectric memory cells, the threshold voltage is controlled by applying positive and negative voltages to the gate electrode and controlling the inversion of the polarization domains in the ferroelectric layer. Therefore, crystal grain size and crystal orientation of the ferroelectric layer are varied, and this causes a problem that the variation of the threshold voltage with respect to the gate voltage is increased. Hence, there is a need to align the crystal grain size and crystal orientation of the ferroelectric layer and to improve the performance of semiconductor device.

In this respect, one may consider forming the grains comprising aluminum (Al) in the ferroelectric layer to suppress the variation of the crystal grain size and crystal orientation of the ferroelectric layer. However, the forming the grains alone may still cause variations in the polarization characteristics at the time of operation between ferroelectric memory cells.

In addition, in a ferroelectric memory cell equipped with a ferroelectric layer, the heat resistance of the ferroelectric layer is low, and when a semiconductor device is exposed to a high temperature in the manufacturing process, crystallization of the ferroelectric layer becomes unstable, and thus, the reliability of the semiconductor device may decrease.

Other objects and novel features will become apparent from the description of this specification and the accompanying drawings.

The typical ones of the embodiments disclosed in the present application will be briefly described as follows.

A method for manufacturing a semiconductor device according to an embodiment comprises the followings: (a) forming a first amorphous film comprising hafnium, oxygen and a first element; (b) forming a plurality of first grains comprising a second element different from any of hafnium, oxygen and the first element on the first amorphous film; (c), after the (b), forming an insulating film comprising a third element different from any of hafnium, oxygen, the first element and the second element on the first amorphous film; (d) forming a second amorphous film comprising hafnium, oxygen and the first element on the insulating film; (e) forming a first metal film on the second amorphous film; and (f) performing a heat treatment, after the (e), to crystallize the first amorphous film to form a first ferroelectric film that is orthorhombic, and to crystallize the second amorphous film to form a second ferroelectric film that is orthorhombic.

According to one embodiment, the performance of semiconductor device can be improved.

BRIEF DESCRIPTION OF THE DRAWINGS

FIG. 3 shows a table showing an example of conditions for applying a voltage to each portion of the selected memory cell at the time of "write", "erase" and "read".

FIG. 21 shows a cross-sectional view showing the manufacturing process of semiconductor device of comparative example.

DETAILED DESCRIPTION

Figure 1:
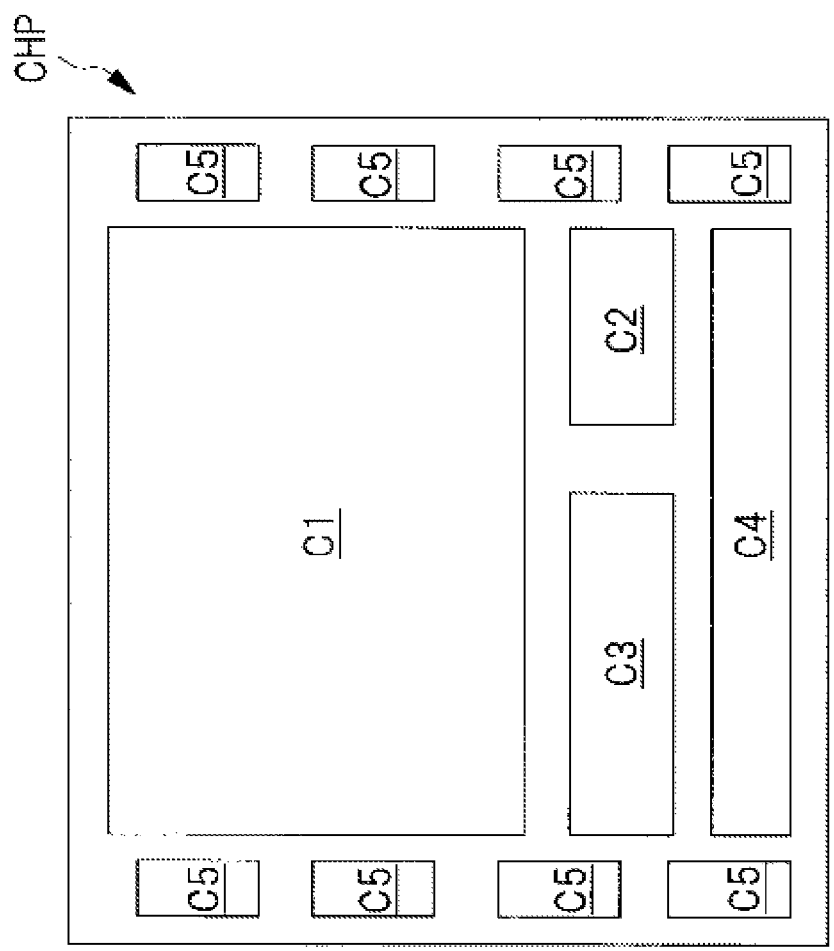
FIG. 1 shows a plain layout view of a semiconductor chip, that is a semiconductor device according to the first embodiment.

In the following embodiments, when necessary for convenience, will be described by dividing into a plurality of sections or embodiments, unless otherwise specified, they are not unrelated to each other, one of which is related to some or all of the other modified example, detailed, supplementary explanation, etc. In addition, in the following embodiments, the number of elements or the like (including the number, the value, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of constituent elements and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see.

First Embodiment

Referring to the drawings, a semiconductor device having a ferroelectric memory cell which is a nonvolatile memory cell in the present embodiment will be described. First, a planar layout configuration of a semiconductor chip CHP which is a semiconductor device in which a system including a ferroelectric memory cell is formed will be described with reference to FIG. 1. As shown in FIG. 1, the semiconductor chip CHP has a ferroelectric memory circuit C1 and a CPU (Central Processing Unit) circuit C2. The semiconductor chip CHP further includes a RAM (Random Access Memory) circuit C3, an analogue circuit C4, and an I/O (Input/Output) circuit C5.

The ferroelectric memory circuit C1 has a circuit capable of electrically rewriting the stored information and, as a semiconductor element, is a region in which a plurality of ferroelectric memory cells, which are nonvolatile memory cells, are formed.

The CPU circuit C2 has a logic circuit for driving at a voltage of about 1.5V. The CPU circuit C2 has a low withstand voltage and, as a semiconductor element, is a region where a MISFET (Metal Insulator Semiconductor Field Effect Transistor) having a low withstand voltage and which operates fast is formed.

The RAM circuit C3 has a SRAM (Static RAM) and, as a semiconductor element, is a region where the low withstand voltage MISFET having substantially the same configuration as that of the CPU circuit C2 is formed.

The analog circuit C4 has an analog circuit and, as a semiconductor element, is a region where a capacitor element, a resistor element, a bipolar transistor, and the like are formed. In the analogue circuit C4, a high withstand voltage MISFET which has a withstand voltage higher than that of the low withstand voltage MISFET and which is driven by a voltage of about 6V is formed.

The I/O circuit C5 has an input/output circuit and, as a semiconductor element, is a region where a high withstand voltage MISFET which is substantially the same as that of the analogue circuit C4 is formed.

<Structure of Semiconductor Device>

Hereinafter, the structure of semiconductor device according to the present embodiment will be described with reference to FIG. 2. In the present embodiment, as an example of the structure of semiconductor device, the ferroelectric memory cell MC formed in the ferroelectric memory circuit C1 and the low withstand voltage MISFET 1Q formed in the CPU circuit C2 will be described.

Figure 2:
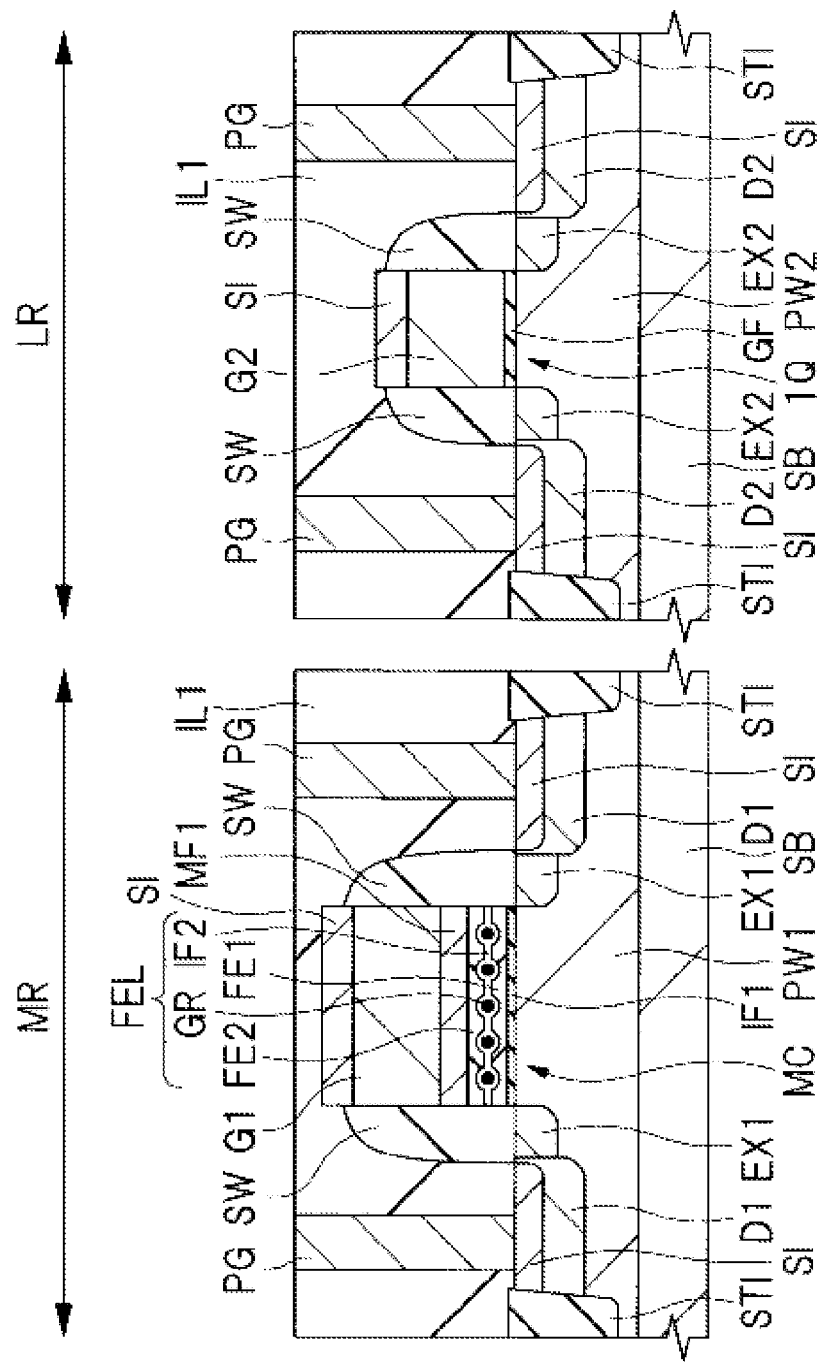
FIG. 2 shows a cross-sectional view of semiconductor device related to the first embodiment.

As shown in FIG. 2, the semiconductor device of the present embodiment comprises a region MR in which the ferroelectric memory cell MC is formed and a region LR in which the low withstand voltage MISFET 1Q is formed.

A semiconductor substrate (Semiconductor Wafer) SB comprises, for example, p-type monocrystalline silicon (Si) having a specific resistivity of about 1-10 Ωcm. A p-type well region PW1 is formed in the semiconductor substrate SB in the region MR, and a p-type well region PW2 is formed in the semiconductor substrate SB in the region LR. A plurality of element isolation portion STI are formed in the well region PW1 and the well region PW2. The element isolation portion STI is formed by embedding an insulating film, such as a silicon oxide film, in the trench formed in the semiconductor substrate SB.

First, the structure of the ferroelectric memory cell MC in the region MR will be described. In the present embodiment, as a ferroelectric memory cell MC, a memory cell called a MFIS (Metal Ferroelectric Insulator Semiconductor) structure in which a ferroelectric layer FEL is applied to a transistor structure is referenced as an example. The ferroelectric memory cell MC is formed of the ferroelectric layer FEL and a gate electrode G1 formed in order on the semiconductor substrate SB, and a transistor comprising a source region and a drain region formed on the semiconductor substrate SB.

In the region MR, the insulating film IF1 is formed on the semiconductor substrate SB comprising the well region PW1. The insulating film IF1 comprises, for example, a silicon oxide film or a silicon oxynitride film, and has a thickness of, for example, 1 nm to 3 nm. The insulating film IF1 is formed with the purpose of stabilizing the interface between the semiconductor substrate SB and the ferroelectric layer FEL to be described later. Alternatively, the insulating film IF1 is formed to prevent electrons from entering the ferroelectric layer FEL from the semiconductor substrate SB when voltages are applied to the gate electrode G1 during the operation of the ferroelectric memory cell MC. Therefore, if one or more of these objectives can be achieved, the insulating film IF1 may not be provided.

On the insulating film IF1, the ferroelectric layer FEL is formed. The ferroelectric layer FEL has a ferroelectric film FE1 and a ferroelectric film FE2 stacked in the longitudinal direction. The ferroelectric layer FEL further comprises a plurality of grains GR and an insulating film IF2 formed between the ferroelectric film FE1 and the ferroelectric film FE2. The insulating film IF2 is a film formed between the ferroelectric film FE1 and the ferroelectric film FE2, and a part or the whole of each of the plurality of grains GR is covered by the insulating film IF2. The longitudinal direction (vertical direction) used herein is the direction perpendicular to upper surface (main surface) of the semiconductor substrate SB. Thus, the ferroelectric layer FEL of the present embodiment is divided into at least two layers or more by sandwiching the insulating film IF2. For the clarity of illustration, hatching of the insulating film IF2 is omitted in FIG. 2 and in the subsequent figures used for explanations.

Each of the ferroelectric film FE1 and the ferroelectric film FE2 comprises a metal oxide film, for example, a high dielectric constant film having the dielectric constant higher than that of the silicon nitride film. The thickness of each of the ferroelectric film FE1 and the ferroelectric film FE2 is, for example, 5 nm. The insulating film IF2 has a film thickness of 2 nm or less. The thickness of the insulating film IF2 here is, for example, 2 nm. In this case, the thickness of the ferroelectric layer FEL is 12 nm, for example.

In addition, in each of the ferroelectric film FE1 and the ferroelectric film FE2, the dielectric polarization is generated when an electric field is applied, and the each is the material in which the polarization is maintained even when the electric field is removed, that is, an insulating film composed of a ferroelectric material. That is, even when an electric field is not applied, polarization remains in the ferroelectric film FE1 and the ferroelectric film FE2. Ferroelectrics are materials in which electric dipoles are aligned even without an external electric field and the direction of the dipoles can be changed by the electric field.

Then, each of the ferroelectric film FE1 and the ferroelectric film FE2 needs to be an orthorhombic crystal. In other words, a film mainly composed of the crystal other than an orthorhombic crystal is a paraelectric film. In the ferroelectric memory cell MC, it is important to realize an increase of remnant polarization of the ferroelectric layer FEL, improvement of performance as ferroelectrics, and reduction of driving power of the ferroelectric memory cell MC. For this purpose, crystals constituting the ferroelectric film FE1 and the ferroelectric film FE2 need to be formed as orthorhombic as possible. The crystal grain size of each of the ferroelectric film FE1 and the ferroelectric film FE2 is, for example, 5-50 nm.

In the present embodiment, each of the ferroelectric film FE1 and the ferroelectric film FE2 is, for example, an insulating film comprising hafnium (Hf), and comprises oxygen (O) in addition to hafnium. Each of the ferroelectric film FE1 and the ferroelectric film FE2 comprises, for example, zirconium (Zr) as a first element in addition to hafnium. Instead of zirconium, the first element may be silicon (Si), yttrium (Y), lanthanum (La), or ytterbium (Yb).

Each of the ferroelectric film FE1 and the ferroelectric film FE2 comprises, for example, hafnium oxide ($HfO_2$). When the first element is zirconium, each of the ferroelectric film FE1 and the ferroelectric film FE2 comprises, for example, $HfO_2$ comprising zirconium, that is, HfZrO. When the first element is silicon, each of the ferroelectric film FE1 and the ferroelectric film FE2 comprises, for example, a $HfO_2$ comprising silicon, that is, HfSiO.

Between the ferroelectric film FE1 and the ferroelectric film FE2, as a part of the ferroelectric layer FEL, a plurality of grains GR are formed. As described later, the plurality of grains GR are nanostructures that function as crystal nuclei to make the ferroelectric film FE1 and the ferroelectric film FE2 as orthorhombic crystal during the manufacturing process of the ferroelectric layer FEL. Therefore, each of the plurality of grains GR is separated from each other. In other words, the plurality of grains GR are formed discontinuously rather than a continuously-formed layer such as the ferroelectric film FE1 and the ferroelectric film FE2. If each of the plurality of grains GR is formed as a film where the plurality of grains are connected each other, the function as the crystal nuclei of the plurality of grains GR is deteriorated.

The plurality of grains GR comprise a second element different from any of hafnium, oxygen and the first element. The second element is, for example, aluminum (Al). The second element may be carbon (C), nitrogen (N), fluorine (F), or titanium (Ti), instead of aluminum. In addition, as one of the main features of the present embodiment, the second element constituting each of the plurality of grains GR is combined with a third element. The third element is different from hafnium and the second element. The third element is also included in the insulating film IF2. It is also conceivable that the second element is bonded to oxygen.

The insulating film IF2 comprises, for example, a $SiO_2$ film, that is, a silicon oxide film. In this case, the third element is silicon. That is, each of the plurality of grains GR comprises Al—Si, which is a compound of aluminum and silicon, for example. That is, each of the plurality of grains GR is an Al—Si cluster. Specifically, each of the plurality of grains GR comprises, for example, $Al_xSi_yO_z$. In the present embodiment, each of the plurality of grains GR is, for example, formed of an aggregate of 2 to 4 atoms. The third element may be germanium (Ge) instead of silicon.

The insulating film IF2 covers the whole or a part of the surface of each of the plurality of grains GR and is in contact with the plurality of grains GR. The insulating film IF2 is a film continuously provided across the plurality of grains GR which are separated from each other.

The plurality of grains GR are not diffused throughout the ferroelectric film FE1 and the ferroelectric film FE2, and stay near the interface between the ferroelectric film FE1 and the ferroelectric film FE2. Therefore, the peak of the concentration of the plurality of grains GR in the ferroelectric layer FEL is higher at the position close to the interface between the ferroelectric film FE1 and the ferroelectric film FE2 than at the position close to the lower surface of the ferroelectric film FE1 and the position close to the upper surface of the ferroelectric film FE2. In other words, in the ferroelectric layer FEL, the peak of the concentration of the second element and the third element is between the ferroelectric film FE1 and the ferroelectric film FE2. That is, the concentration of the second element and the third element in the ferroelectric film FE1 is smaller on the opposite side of the ferroelectric film FE2 (the semiconductor substrate SB side) than on the ferroelectric film FE2 side. The concentration of the second element and the third element in the ferroelectric film FE2 is smaller on the opposite side of the ferroelectric film FE1 (the side of the metal film MF1 described later) than on the ferroelectric film FE1 side.

The ratio of the first element in the ferroelectric layer FEL is 30 to 50%, and the total ratio of the second element and the third element is 5% or less. That is, each ratio of the second element and the third element in the ferroelectric layer FEL is smaller than the ratio of the first element. The ratio of hafnium dioxide ($HfO_2$) in the ferroelectric layer FEL is, for example, around 50-70%.

Thus, the plurality of grains GR are present near the interface between the ferroelectric film FE1 and the ferroelectric film FE2. Therefore, each of the ferroelectric film FE1 and the ferroelectric film FE2 is easily formed as an orthorhombic crystal having a highly uniform crystal grain size. Therefore, when the ferroelectric layer FEL is applied to the ferroelectric memory cell MC, it is possible to suppress the problem that the variation of the threshold voltage is increased due to the polarization reversal of the ferroelectric layer FEL. Therefore, it is possible to suppress a problem that the rewrite durability of the ferroelectric memory cell MC is lowered and/or a problem that the retention characteristic is lowered. In other words, a technique according to the present embodiment can improve the performance of semiconductor device.

On the ferroelectric layer FEL, a metal film MF1 is formed. The metal film MF1 is a conductive film comprising, for example, a titanium nitride film, a tantalum nitride film, or a tungsten film. The thickness of the metal film MF1 is, for example, 10 nm to 20 nm. The metal film MF1 is a capping film provided to provide stress to the ferroelectric film FE1 and the ferroelectric film FE2 during the manufacturing process of the ferroelectric layer FEL to control the crystal orientation of each of the ferroelectric film FE1 and the ferroelectric film FE2. Therefore, after forming the ferroelectric layer FEL, if each of the ferroelectric film FE1 and the ferroelectric film FE2 can be present as an orthorhombic crystal, the metal film MF1 may be removed. However, since the crystal orientation of each of the ferroelectric film FE1 and the ferroelectric film FE2 may vary if the metal film MF1 is removed, it is more preferable to leave the metal film MF1. When the metal film MF1 is left, the metal film MF1 functions as a part of a gate electrode together with a gate electrode G1 described later. The crystal orientation of each of the ferroelectric film FE1 and the ferroelectric film FE2 is (001) orientation.

On the metal film MF1, the gate electrode G1 is formed. The gate electrode G1 is a conductive film comprising a polycrystalline silicon film in which, for example, n-type impurities are introduced. Instead of the polycrystalline silicon film, a metal film such as a titanium nitride film, an aluminum film, or a tungsten film, or a stacked film in which two or more of these films are appropriately stacked, may be used as a material for forming the gate electrode G1.

Sidewall spacers SW are formed on the side surfaces of the gate electrode G1. The sidewall spacers SW, for example, comprise stacked films of a silicon oxide film and a silicon nitride film.

Extension regions EX1, which are low-concentration n-type impurity regions, are formed in the well region PW1 under the sidewall spacers SW over a predetermined depth from upper surface of the semiconductor substrate SB.

Further, diffusion regions D1 which are n-type impurity regions of higher concentration than the extension regions EX1 are formed in the position of the well region PW1 matching the side wall spacers SW. The diffusion regions D1 are formed at a predetermined depth from upper surface of the semiconductor substrate SB. The diffusion regions D1 are formed at positions farther from the extension regions EX1 with respect to the semiconductor substrate SB directly under the gate electrode G1.

Each of the extension regions EX1 and the diffusion regions D1 is formed in pairs so to sandwich the semiconductor substrate SB directly under the gate electrode G1. One side of the pair of the extension regions EX1 and one side of the pair of the diffusion regions D1 are connected to each other to constitute a source region of the ferroelectric memory cell MC. The other side of the pair of the extension regions EX1 and the other side of the pair of the diffusion regions D1 are connected to each other to constitute a drain region of the ferroelectric memory cell MC.

A silicide layer SI comprising, for example, cobalt silicide ($CoSi_2$), nickel silicide (NiSi) or nickel platinum silicide (NiPtSi), is formed on the gate electrode G1 and on the diffusion regions D1. The silicide layer SI is formed mainly to reduce contact resistance with the plug PG, which will be described later.

Next, the structure of the low withstand voltage MISFET 1Q of the region LR is explained.

In the region LR, the gate insulating film GF is formed on the semiconductor substrate SB including the well region PW2. The gate insulating film GF is, for example, a silicon oxide film and has a thickness of, for example, 1 nm to 4 nm.

On the gate insulating film GF, a gate electrode G2 is formed. The gate electrode G2 is a conductive film comprising a polycrystalline silicon film in which, for example, n-type impurities are introduced. Instead of the polycrystalline silicon film, a metal film such as a titanium nitride film, an aluminum film, or a tungsten film, or a stacked film in which two or more of these films are stacked as appropriate, may be used as a material for forming the gate electrode G2.

On the side surfaces of the gate electrode G2, side wall spacers SW are formed. The sidewall spacers SW, for example, comprise stacked films of a silicon oxide film and a silicon nitride film.

Extension regions EX2, which are low-concentration n-type impurity regions, are formed in the well region PW2 under the sidewall spacers SW. Diffusion regions D2, which are an n-type impurity regions having higher concentration than the extension regions EX2, are formed in the position of the well region PW2 matching the sidewall spacers SW. Each of the extension regions EX2 and the diffusion regions D2 constitutes a portion of the source region and a portion of the drain region of MISFET 1Q, respectively. Each of the extension region EX2 and the diffusion region D2 has the structure similar to that of the extension region EX1 and the diffusion region D1, respectively.

The impurity concentration of the extension region EX1 in the region MR and the impurity concentration of the extension region EX2 in the region LR are substantially the same. The impurity concentration of the diffusion region D1 in the region MR and the impurity concentration of the diffusion region D2 in the region LR are substantially the same.

On the gate electrode G2 and on the diffusion regions D2, a silicide layer SI comprising, for example, cobalt silicide ($CoSi_2$), nickel silicide (NiSi) or nickel platinum silicide (NiPtSi), is formed. The silicide layer SI is formed mainly to reduce contact resistance with a plug PG, which will be described later.

An interlayer insulating film IL1 is formed on the ferroelectric memory cell MC formed in the region MR and on MISFET 1Q formed in the region LR. The interlayer insulating film IL1 is, for example, a silicon oxide film. In the interlayer insulating film IL1, a plurality of contact holes penetrating the interlayer insulating film IL1 from the upper surface to the lower surface is formed, and in the plurality of contact holes, a plurality of plugs PG are formed. The plug PG comprises, for example, a barrier metal film comprising a titanium film, a titanium nitride film, or a stacked film thereof, and a conductive film mainly formed of tungsten. In FIG. 2, however, the barrier metal film and the main conductive film are not distinguished from each other, and the plug PG comprising the barrier metal film and the main conductor film is shown. The plug PG is electrically connected to the diffusion regions D1 or the diffusion regions D2 through the silicide layer SI. Although not shown, the plug PG electrically connected to the gate electrodes G1 and G2 also exist in the interlayer insulating film IL1.

Further, although not shown in the figure, on the interlayer insulating film IL1 and the plug PG, a plurality of interconnects are formed. For example, on the interlayer insulating film IL1, the interlayer insulating film is formed, and in this interlayer insulating film, trenches for interconnects are formed. Then, in the trenches for interconnects, the conductive film mainly formed of, for example, copper is embedded so to form a first layer of the interconnects connected to the plug PG.

<Operation of Ferroelectric Memory Cell MC>

Next, an operation example of the ferroelectric memory cell MC will be described with reference to FIG. 3.

FIG. 3 is a table showing an example of the voltage applied to each portion of the selected memory cell of the ferroelectric memory cell MC at the time of "write", "erase" and "read". In the table of FIG. 3, at the time of each operation of "write", "erase" and "read", the voltage Vd applied to the drain region (one side of the diffusion region D1), the voltage Vg applied to the gate electrode G1, the voltage Vs applied to the source region (the other side of the diffusion region D1) and the voltage Vb applied to the well region PW1 of the ferroelectric memory cell MC shown in FIG. 2 are described. Note that what is shown in the table of FIG. 3 is a preferred example of a condition of a voltage application, and it is not limited to this and can be variously changed as necessary.

In addition, in the present embodiment, it is defined as "write" that the polarization of the ferroelectric layer FEL becomes upward and the threshold voltage of the ferroelectric memory cell MC becomes relatively high. Then, it is defined as "erase" that the polarization of the ferroelectric layer FEL becomes downward and the threshold voltage of the ferroelectric memory cell MC becomes relatively low.

The write operation is performed by applying a negative voltage to the gate electrode G1. That is, for example, a voltage as shown in the column of "write" in FIG. 3 is applied to each portion of the selected memory cell to be written. The polarization of the ferroelectric layer FEL becomes upward accordingly, and the threshold voltage of the ferroelectric memory cell MC is increased, hence the ferroelectric layer FEL becoming a write state.

The erase operation is performed by applying a positive voltage to the gate electrode G1. That is, for example, a voltage as shown in the column of "erase" in FIG. 3 is applied to each portion of the selected memory cell to be erased. The polarization of the ferroelectric layer FEL becomes downward accordingly, and the threshold voltage of the ferroelectric memory cell MC is lowered, hence the ferroelectric layer FEL becoming an erase state.

In the read operation, for example, a voltage as shown in the column of "read" in FIG. 3 is applied to each portion of the selected memory cell to be read. By setting the voltage Vg to be applied to the gate electrode G1 to a value between the threshold voltage of the ferroelectric layer FEL in the write state and the threshold voltage of the ferroelectric layer FEL in the erase state, it is possible to determine the write state and the erase state.

<Manufacturing Process of Semiconductor Device>

Manufacturing methods of semiconductor device of the present embodiment will be described below with reference to FIGS. 4 to 17. Each of FIGS. 4 to 17 is a cross-sectional view showing the region MR in which the ferroelectric memory cell MC is formed and the region LR in which the low withstand voltage MISFET 1Q is formed.

Figure 4:
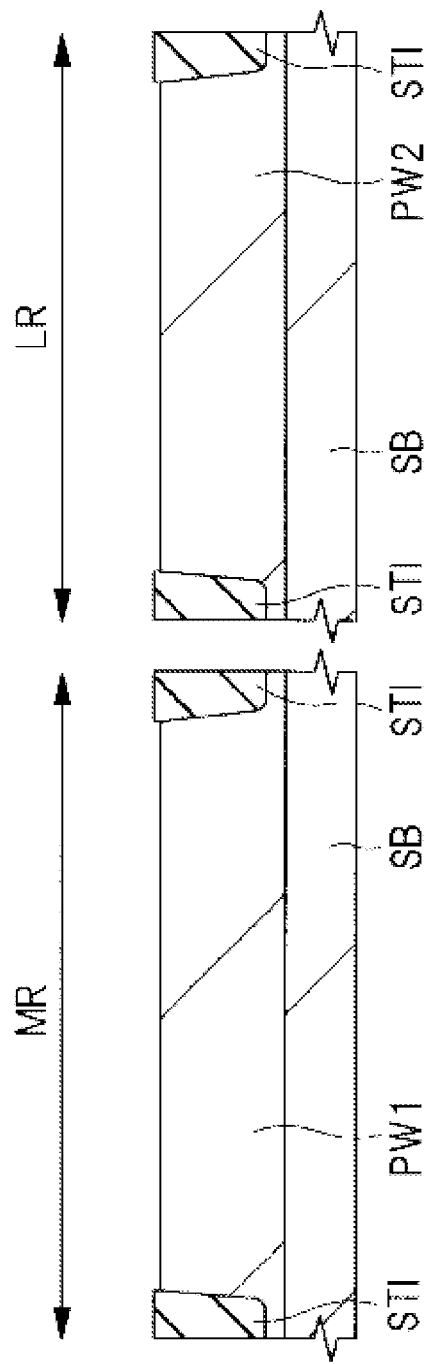
FIG. 4 shows a cross-sectional view showing the manufacturing process of semiconductor device according to the first embodiment.

First, as shown in FIG. 4, prepared is the semiconductor substrate SB comprising, for example, a monocrystalline silicon to which p-type impurities are introduced. Next, on upper surface of semiconductor substrate SB, a trench is formed using a photolithography method and an etching process. Subsequently, an insulating film such as a silicon oxide film is formed so to fill the trench. Thereafter, the insulating film outside the trench is removed by a CMP (Chemical Mechanical Polishing) method, thereby forming the element isolation portion STI comprising the insulating film left in the trench.

Next, the p-type well region PW1 is formed in the region MR and the p-type well region PW2 is formed in the region LR by introducing impurities into the semiconductor substrate SB using a photolithography method and an ion implantation method.

Figure 5:
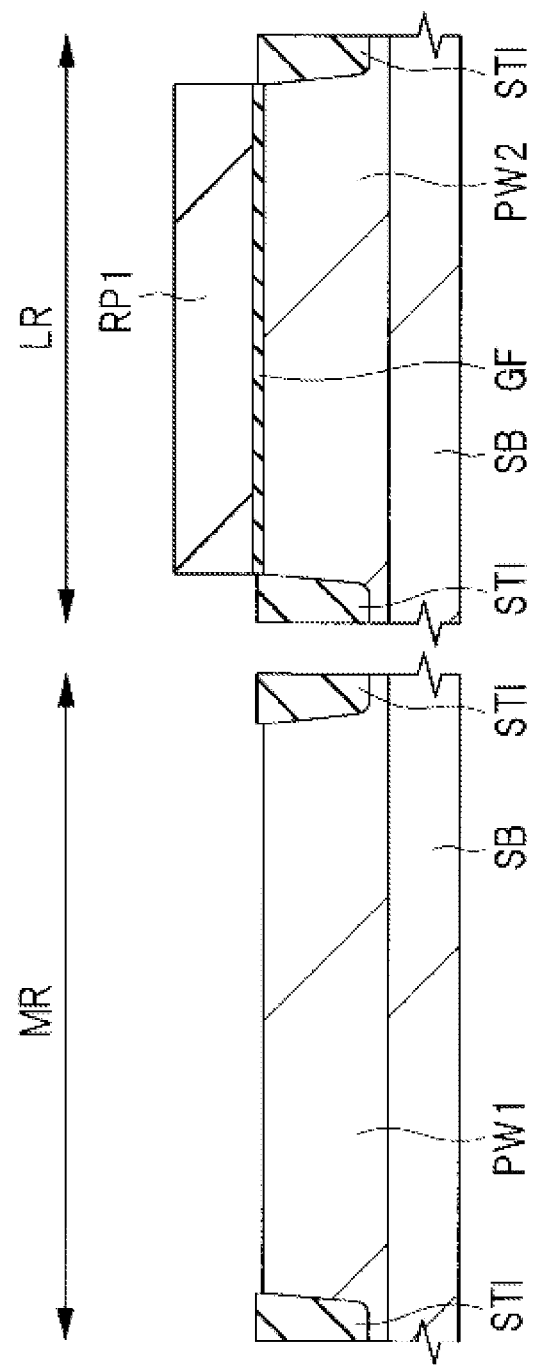
FIG. 5 shows a cross-sectional view showing the manufacturing process of semiconductor device in continuation to FIG. 4.

Next, as shown in FIG. 5, a heat treatment is performed on the semiconductor substrate SB including the well region PW1 in the region MR and the well region PW2 in the region LR in an atmosphere comprising, for example, oxygen. As a result, the gate insulating film GF comprising, for example, silicon oxide is formed on the semiconductor substrate SB in the region MR and the region LR. The thickness of the gate insulating film GF is, for example, 1 nm to 3 nm. Subsequently, the region MR is opened, and a resist pattern RP1 having a pattern covering the region LR is formed. Next, by performing the etching process by using the resist pattern RP1 as a mask, the gate insulating film GF in the region LR is left and the gate insulating film GF in the region MR is removed.

Figure 6:
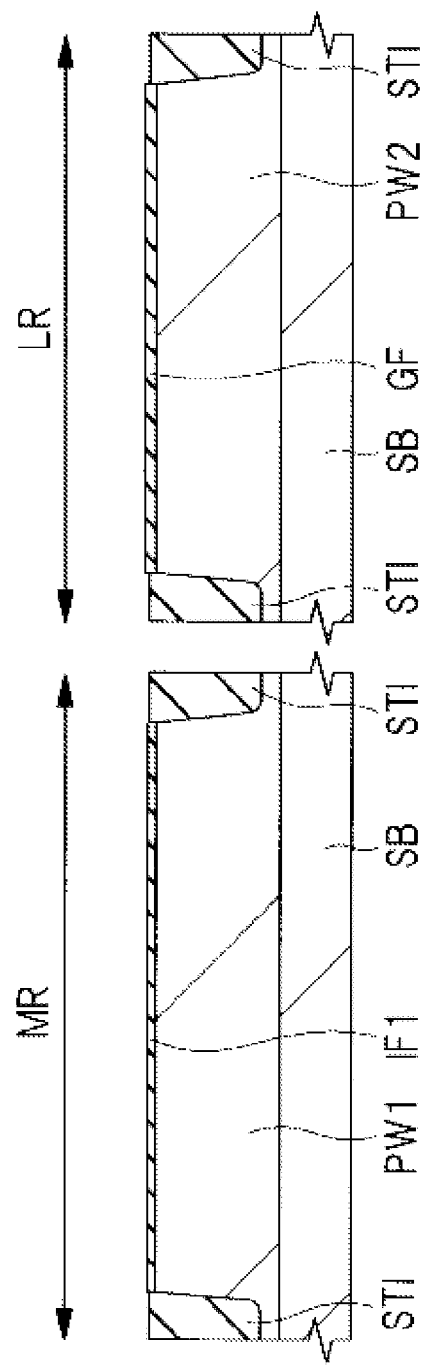
FIG. 6 shows a cross-sectional view showing the manufacturing process of semiconductor device in continuation to FIG. 5.

Next, as shown in FIG. 6, the resist pattern RP1 is removed by, for example, an ashing process. Thereafter, a heat treatment is performed on the semiconductor substrate SB in an atmosphere comprising, for example, oxygen. As a result, an insulating film IF1 comprising, for example, a silicon oxide film or a silicon oxynitride film is formed on the semiconductor substrate SB in the region MR. The thickness of the gate insulating film GF is, for example, 1 nm to 3 nm. At this time, the gate insulating film GF is formed in the region LR, and by this thermal oxidation treatment, the thickness of the gate insulating film GF is slightly increased.

Figure 7:
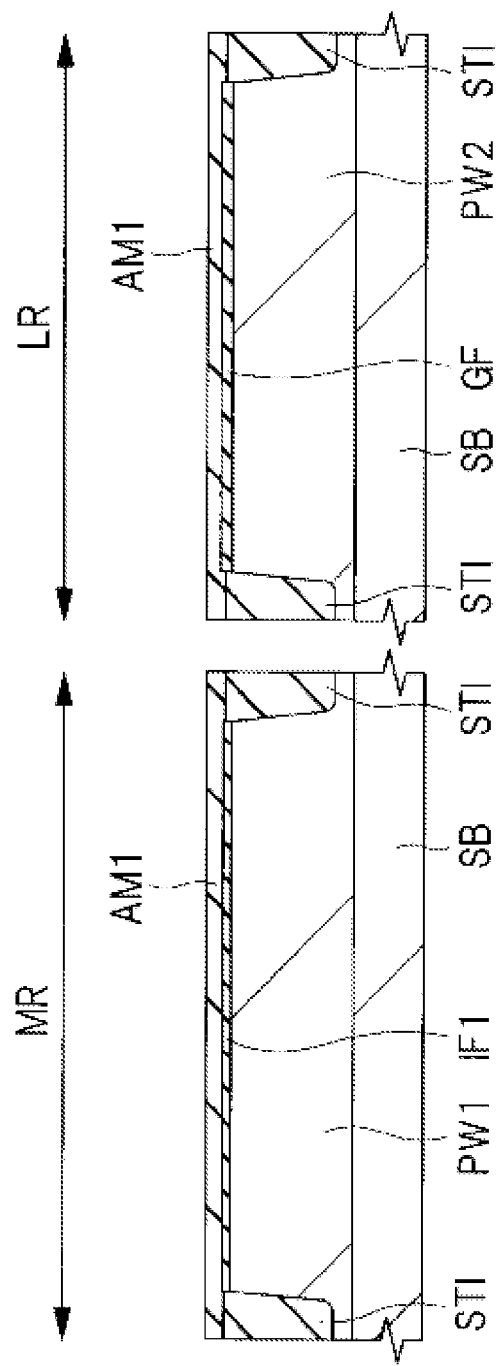
FIG. 7 shows a cross-sectional view showing the manufacturing process of semiconductor device in continuation to FIG. 6.

Next, as shown in FIG. 7, an amorphous film (non-crystalline film) AM1 is formed on the insulating film IF1 in the region MR and on the gate insulating film GF in the region LR by, e.g., an ALD (Atomic Layer Deposition) method. The thickness of the amorphous film AM1 is, for example, 5 nm. The amorphous film AM1 comprises hafnium (Hf), and oxygen (O) in addition to hafnium. The amorphous film AM1 comprises, for example, zirconium (Zr) as the first element in addition to hafnium. Instead of zirconium, the first element may be any of silicon (Si), yttrium (Y), lanthanum (La), or ytterbium (Yb).

Figure 8:
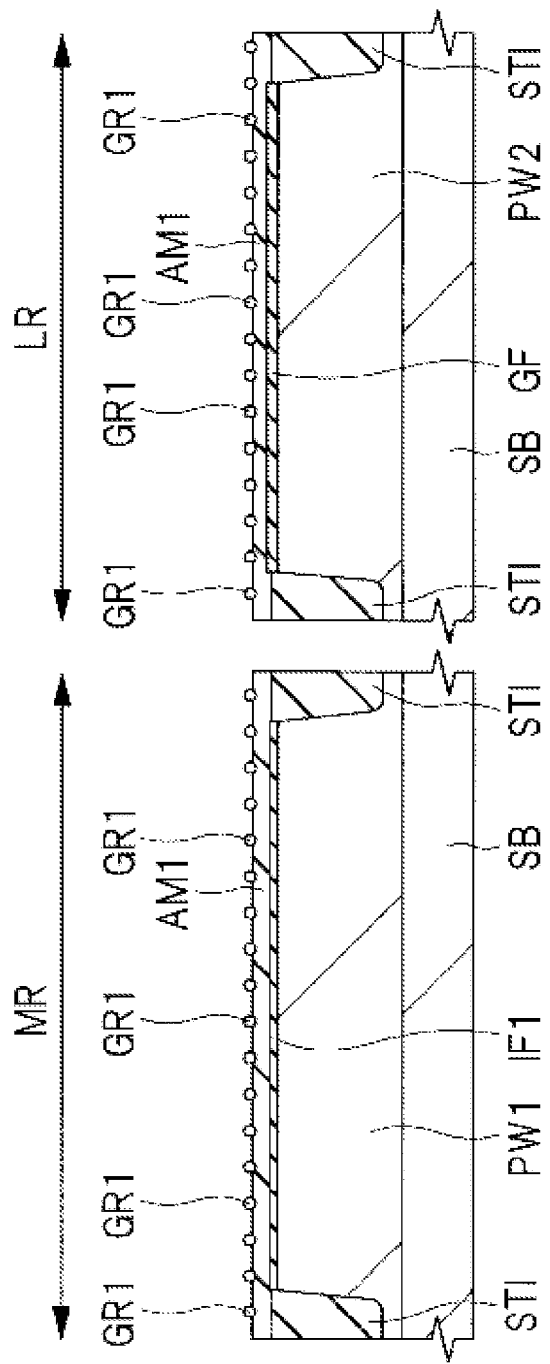
FIG. 8 shows a cross-sectional view showing the manufacturing process of semiconductor device in continuation to FIG. 7.

Next, as shown in FIG. 8, a plurality of grains GR1 are formed on the amorphous film AM1. In the present embodiment, the plurality of grains GR1 are formed on the amorphous film AM1 in the region MR and in the region LR by a sputtering method. In FIG. 8, each of the plurality of grains GR1 is indicated by a white circle that is not hatched. Each of the plurality of grains GR1 is spaced apart from each other. In other words, the plurality of grains GR1 are not formed continuously as in the amorphous film AM1, but is formed discontinuously. That is, the plurality of grains GR1 do not cover the entire upper surface of the amorphous film AM1, but are scattered on the amorphous film AM1. Therefore, a part of the amorphous film AM1 is covered with the plurality of grains GR1, and the other part of the amorphous film AM1 is exposed from the plurality of grains GR1. In addition, although a part of the plurality of grains GR1 is deposited on upper surface of the amorphous film AM1, the plurality of grains GR1 introduced in the vicinity of upper surface in the amorphous film AM1 also exist. Therefore, in the process of crystallizing an amorphous film AM1 described later, the plurality of grains GR described later can function as crystal nuclei.

The plurality of grains GR1 comprise a second element differing from any of hafnium, oxygen and the first element. The second element is, for example, aluminum (Al). The second element may be carbon (C), nitrogen (N), fluorine (F), or titanium (Ti) instead of aluminum. Note that, in the present embodiment, a case where the second element is aluminum is exemplarily described as an example.

The plurality of grains GR1 may be formed by a CVD (Chemical Vapor Deposition) method instead of a sputtering method, but as described above, it is preferable to form the plurality of grains GR1 so to be separated from each other. Therefore, it is preferable that the plurality of grains GR1 are to be formed by a sputtering method. This is because, according to the sputtering method, it is relatively easy to form the plurality of grains GR1 uniformly and in the controlled manner. The areal density of the plurality of grains GR1 with respect to upper surface of the amorphous film AM1 is within the range of $1 \times 10^{13}/cm^2 \sim 1 \times 10^{15}/cm^2$. As a result, the plurality of grains GR1 are uniformly added onto upper surface of the amorphous film AM1. Furthermore, by setting the areal density of the plurality of grains GR1 in the range of $1 \times 10^{13}/cm^2 \sim 1 \times 10^{15}/cm^2$, the radius of the crystal grain of a plurality of grains GR1 can be precisely controlled, for example, in the range of 0.1 nm to 1 nm.

In order to prevent the plurality of grains GR1 from being excessively diffused into the amorphous film AM1, the sputtering method is preferably performed at temperatures ranging from 1° C. to 150° C. Here, the process of forming the plurality of grains GR1 by the above-mentioned sputtering method is performed, for example, at room temperature (25° C.)

As described above, the second element constituting the plurality of grains GR1 may be an element other than aluminum. Note that when the second element is an element other than aluminum, the plurality of grains GR1 can be formed by an ion implantation method instead of a sputtering method. When the ion implantation method is used, the dosage of the plurality of grains GR1 is within the $1 \times 10^{13}/cm^2 \sim 1 \times 10^{15}/cm^2$ range.

Figure 9:
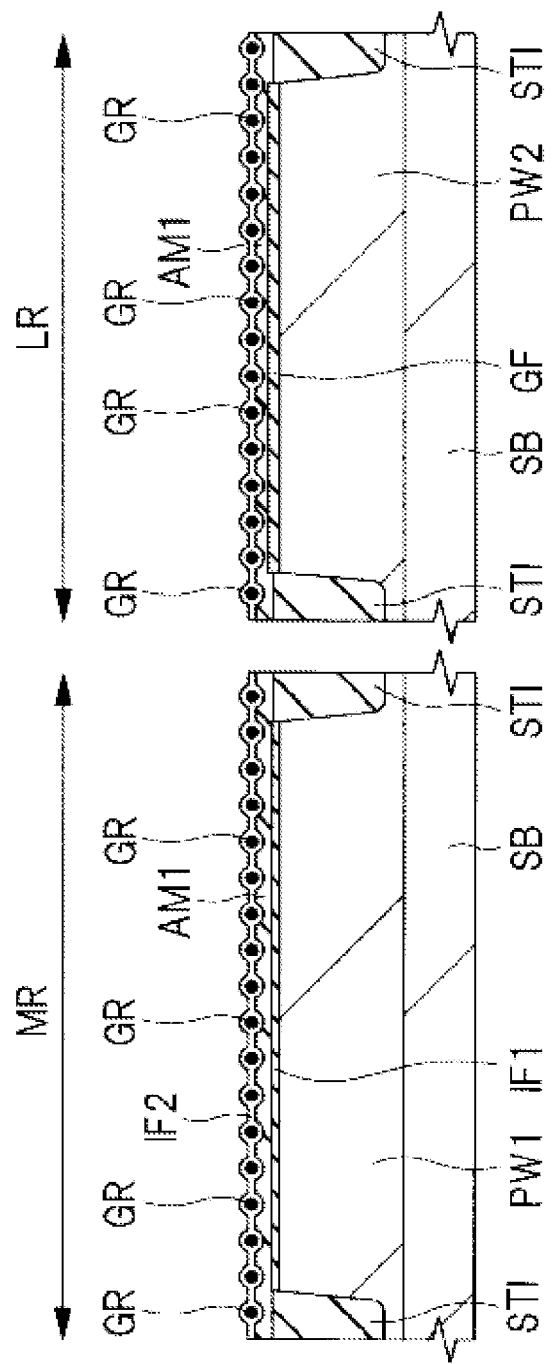
FIG. 9 shows a cross-sectional view showing the manufacturing process of semiconductor device in continuation to FIG. 8.

Next, as shown in FIG. 9, an insulating film IF2 is formed (deposited) on the semiconductor substrate SB using, for example, an ALD method. The insulating film IF2 comprises a third element different from any of hafnium and the second element. The insulating film IF2 comprises, for example, a $SiO_2$ film, that is, a silicon oxide film, and in that case, the third element is silicon (Si).

Thus, upper surface of the amorphous film AM1 is covered by the insulating film IF2. Further, when the insulating film IF2 is formed, the second element constituting the plurality of grains GR1 reacts with the third element, thereby forming a plurality of grains GR, which are nano-structures formed of compounds in which the second element and the third element are bonded. Here, each of the plurality of grains GR comprises, for example, Al—Si, which is a compound of aluminum and silicon. That is, each of the plurality of grains GR is Al—Si cluster. Specifically, each of the plurality of grains GR comprises, for example, $Al_xSi_yO_z$. In the present embodiment, each of the plurality of grains GR is formed of an aggregate of, for example, 2 to 4 atoms. The third element may be germanium (Ge) instead of silicon. In FIG. 9, each of the plurality of grains GR, which is Al—Si cluster, is indicated by a black circle.

The insulating film IF2 covers the whole or a part of each surface of the plurality of grains GR and is in contact with the plurality of grains GR. The insulating film IF2 is a film continuously provided across the plurality of grains GR which are separated from each other.

Here, the deposition process by an ALD method in forming the insulating film IF2 is performed under a condition of 100° C. or more. Specifically, the deposition process is performed under the condition of 300° C. In the deposition process, 1 to 4 cycles of a deposition are performed, wherein 1 cycle of deposition is defined as supplying water ($H_2O$) and silicon tetrachloride ($SiCl_4$) in an ALD device in order. That is, an insulating film IF2 comprising, for example, silicon oxide is formed by one or more times of the deposition by the ALD method. As described above, it is preferable that the number (cycle) of the deposition is 1 to 4, but from the viewpoint of improving reliability, it is most preferable that the number (cycle) is 2. The insulating film IF2 has a film thickness of 1 nm or less. The thickness of the insulating film IF2 here is, for example, 1 nm.

While it has been described to form an insulating film IF2 using the ALD method, instead of the ALD method, the insulating film IF2 may be formed by a low-energy DC (Direct Current) magnetron sputtering method.

Figure 10:
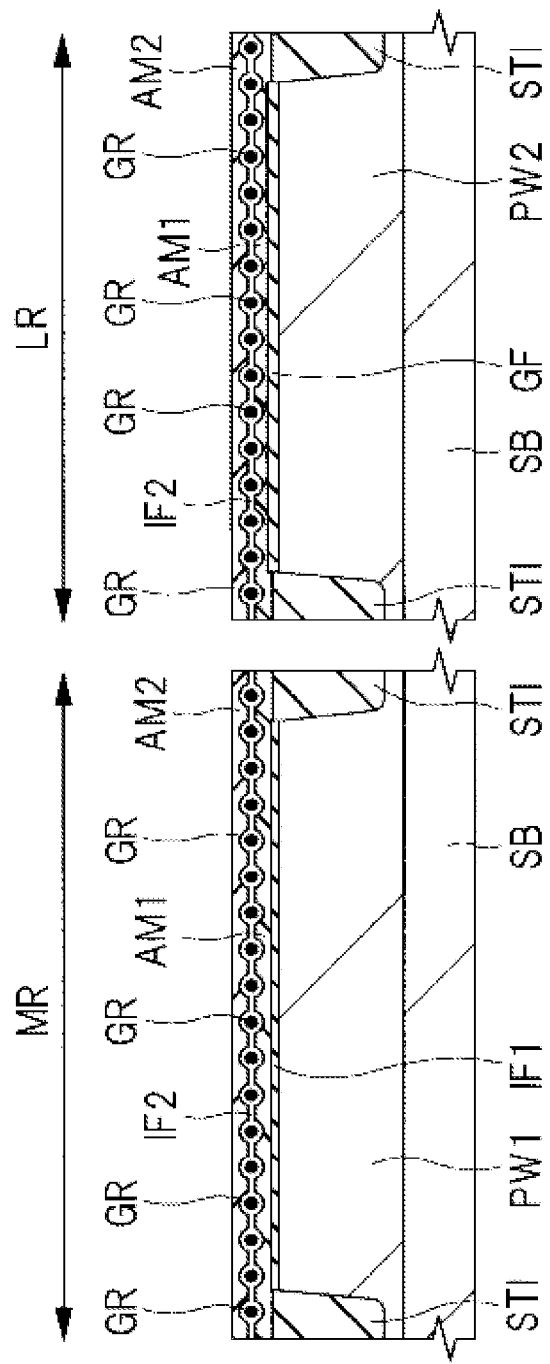
FIG. 10 shows a cross-sectional view showing the manufacturing process of semiconductor device in continuation to FIG. 9.

Next, as shown in FIG. 10, in the region MR and the region LR, an amorphous film (non-crystalline film) AM2 is formed on the insulating film IF2, the plurality of grains GR, and the amorphous film AM1 by, for example, an ALD method. By this process, the plurality of grains GR are covered with the amorphous film AM2. The thickness of the amorphous film AM2 is, for example, 5 nm. The amorphous film AM2 comprises the same materials as the amorphous film AM1, i.e., comprises hafnium (Hf) and oxygen (O) in addition to hafnium. The amorphous film AM2 comprises, for example, zirconium (Zr) as the first element in addition to hafnium. Instead of zirconium, the first element may be silicon (Si), yttrium (Y), lanthanum (La), or ytterbium (Yb).

Figure 11:
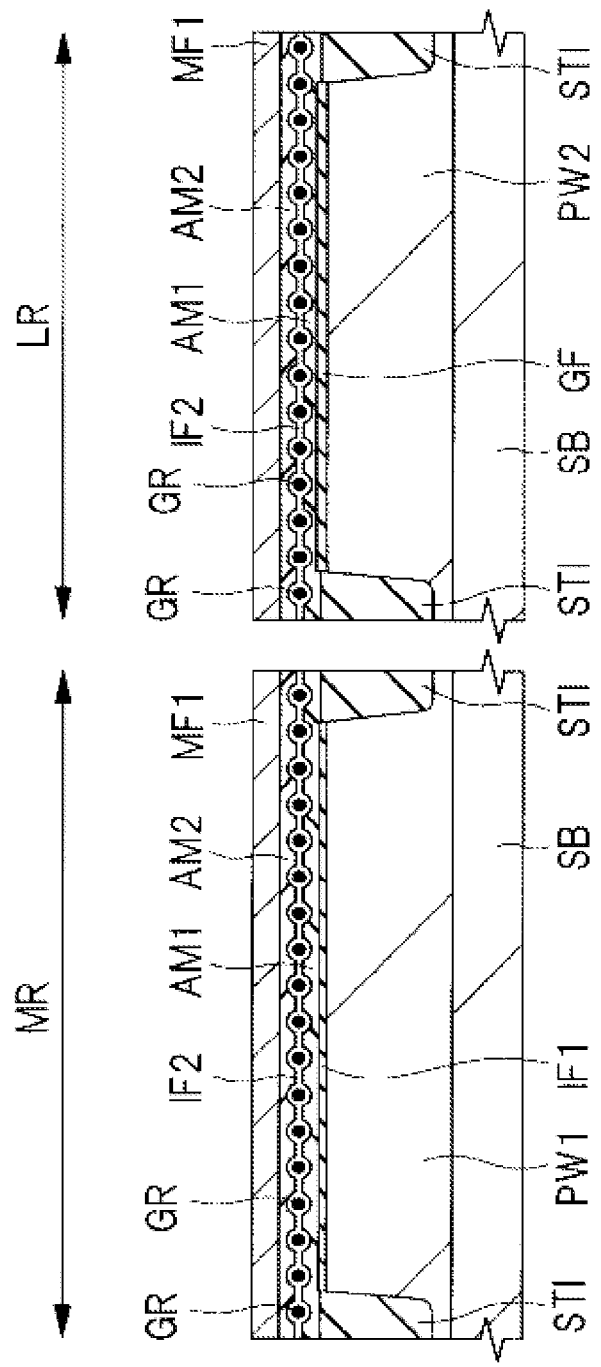
FIG. 11 shows a cross-sectional view showing the manufacturing process of semiconductor device in continuation to FIG. 10.

Next, as shown in FIG. 11, in the region MR and the region LR, a metal film MF1 comprising, for example, titanium nitride, tantalum nitride or tungsten is formed on the amorphous film AM2. The metal film MF1 can be formed by, for example, a CVD method or a sputtering method. The thickness of the metal film MF1 is, for example, 10 nm to 20 nm. The metal film MF1 is a capping film mainly provided for applying stress to the amorphous film AM1 and the amorphous film AM2.

Figure 12:
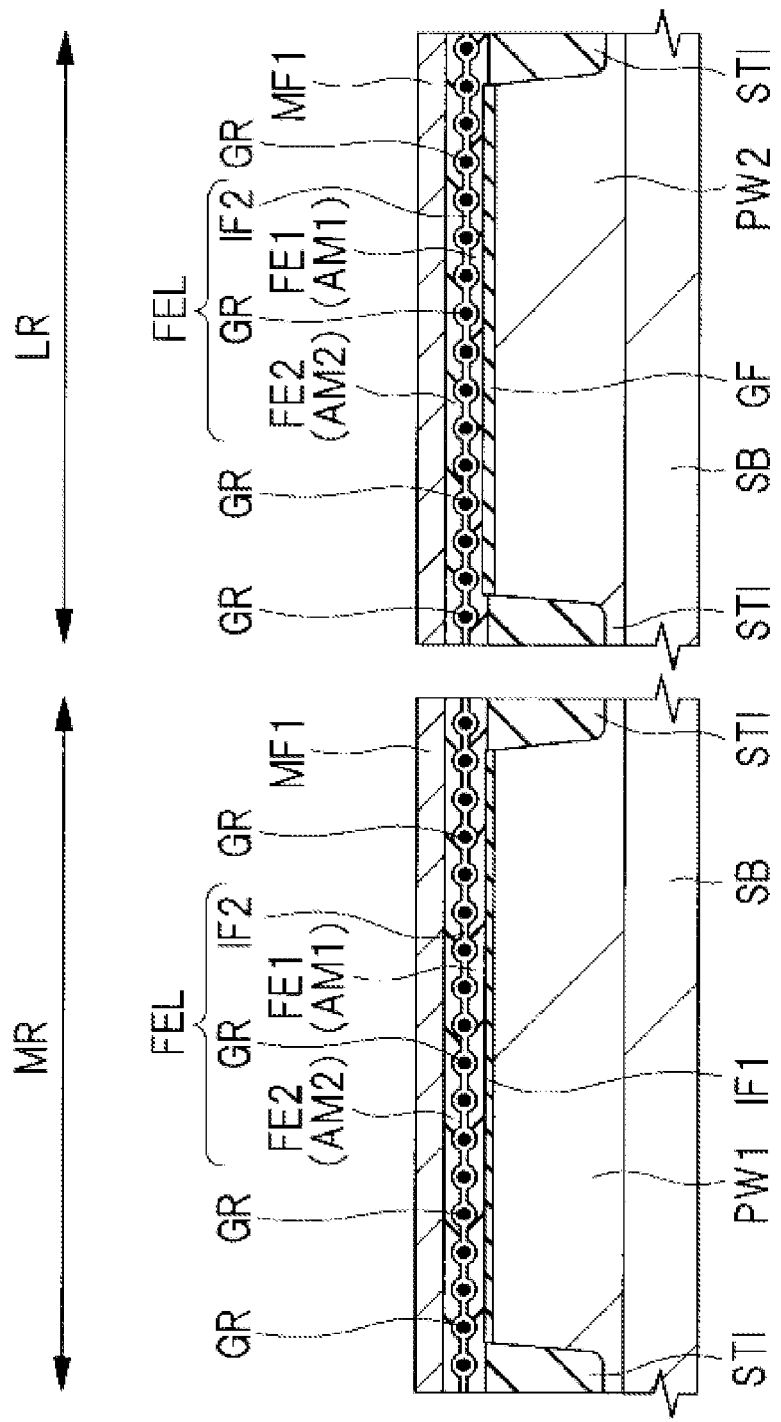
FIG. 12 shows a cross-sectional view showing the manufacturing process of semiconductor device in continuation to FIG. 11.

Next, as shown in FIG. 12, in the region MR and the region LR, a heat treatment is performed at, for example, 600 to 900° C. while the metal film MF1 is formed on the amorphous film AM2. Thus, by crystallizing the amorphous film AM1 and the amorphous film AM2, a ferroelectric film FE1 which is an orthorhombic and a ferroelectric film FE2 which is an orthorhombic are formed, respectively. Specifically, the heat treatment is desirably performed at about 700° C.

The heat treatment can be performed by a RTA (Rapid Thermal Annealing) method at a temperature of less than 600° C., but it is preferable to perform the heat treatment using a microwave having a frequency of 1 GHz to 10 GHz, for example, as an electromagnetic wave, and it is more preferable to perform the heat treatment using a microwave having a frequency of 2.45 GHz. The heat treatment using a microwave enables a crystallization at a lower temperature, for example, at a temperature of 400° C. or less.

In the heat treatment using a microwave, the microwave is irradiated in an oscillation direction of the electric field being 90 degrees (perpendicular) with respect to upper surface of the metal film MF1 or upper surface of the semiconductor substrate SB. Such electromagnetic waves such as microwaves have the property that the ferroelectric film FE1 and the ferroelectric film FE2 which are polarized crystals are easily formed since the energy is absorbed in the polarized crystals. Therefore, as described above, the heat treatment for crystallization can be easily performed at a low temperature of 400° C. or less.

The second and third elements in the crystallized ferroelectric layers FEL have peaks between the ferroelectric film FE1 and the ferroelectric film FE2. That is, the concentration of the second element and the third element in the ferroelectric film FE1 is smaller on the opposite side of the ferroelectric film FE2 than on the ferroelectric film FE2 side. Further, the concentration of the second element and the third element in the ferroelectric film FE2 is smaller on the opposite side of the ferroelectric film FE1 than on the ferroelectric film FE1 side. The reason why the second element and the third element have such a distribution is that the second element and the third element are bonded to each other at the time of heat treatment for crystallization.

For example, if the heat treatment for crystallization is performed at a temperature greater than 900° C., for example, at a temperature of 1000° C. or less, the crystal phase of the ferroelectric film FE1 and the ferroelectric film FE2 tends to be monoclinic. When the crystal phase of the ferroelectric film FE1 and the ferroelectric film FE2 becomes monoclinic, the ferroelectric film FE1 and the ferroelectric film FE2 become a paraelectric film rather than a ferroelectric film, and the ferroelectric memory cell to be formed later becomes inoperative. As in the present embodiment, by performing the heat treatment at a temperature of 900° C. or less, it is easy to form the ferroelectric film FE1 and the ferroelectric film FE2 as an orthorhombic crystal.

Also, in this crystallization process, the orientation of each of the ferroelectric film FE1 and the ferroelectric film FE2 is controlled by stress from the metal film MF1. That is, when the amorphous film AM1 and the amorphous film AM2 are crystallized into the ferroelectric film FE1 and the ferroelectric film FE2, the metal film MF1 has a function to orient the respective crystal phase of the ferroelectric film FE1 and the ferroelectric film FE2 to an orthorhombic.

In the present embodiment, the plurality of grains GR and the insulating film IF2 covering the plurality of grains GR are formed between the amorphous film AM1 and the amorphous film AM2. The plurality of grains GR covered with the insulating film IF2 function as crystal nuclei in the crystallization process.

Hereinafter, for an example of the crystallization process, a case where the second element and the third element constituting the plurality of grains GR are aluminum and silicon, respectively, will be described. The amorphous film AM1 and the amorphous film AM2 crystallize with a plurality of Al—Si grains which are the plurality of grains GR as crystal nuclei, therefore being the ferroelectric film FE1 and the ferroelectric film FE2. Here, the radius of the crystal grain size of the plurality of grains GR is precisely controlled, for example, in the range of 0.1 nm to 1 nm. That is, since the crystal grain size of each of the ferroelectric film FE1 and the ferroelectric film FE2 is aligned in accordance with the crystal grain size of the plurality of grains GR comprising aluminum, silicon and oxygen, the uniformity of the crystal grain size in the ferroelectric layer FEL is improved.

Thus, in the ferroelectric layer FEL, by improving the uniformity of the crystal grain size, the crystal orientation is aligned in an orthorhombic crystal of (001) orientation. When the ferroelectric layer is applied to the ferroelectric memory cell, there is a possibility that the film quality of the ferroelectric layer deteriorates with the polarization reversal of the ferroelectric layer. In that case, as the crystal grain size and crystal orientation of the ferroelectric layer are varied, the variation of the threshold voltage may increase. In contrast, as the present embodiment improves the uniformity of the crystal grain size and the crystal orientation is aligned in an orthorhombic crystal, it is possible to suppress the occurrence of such variations in the crystal grain size and crystal orientation of the ferroelectric layer FEL. Therefore, it is possible to suppress a problem that the rewrite durability of the ferroelectric memory cell MC is lowered and a problem that the retention characteristic is lowered. In other words, a technique of the present embodiment can improve the performance of semiconductor device.

Figure 13:
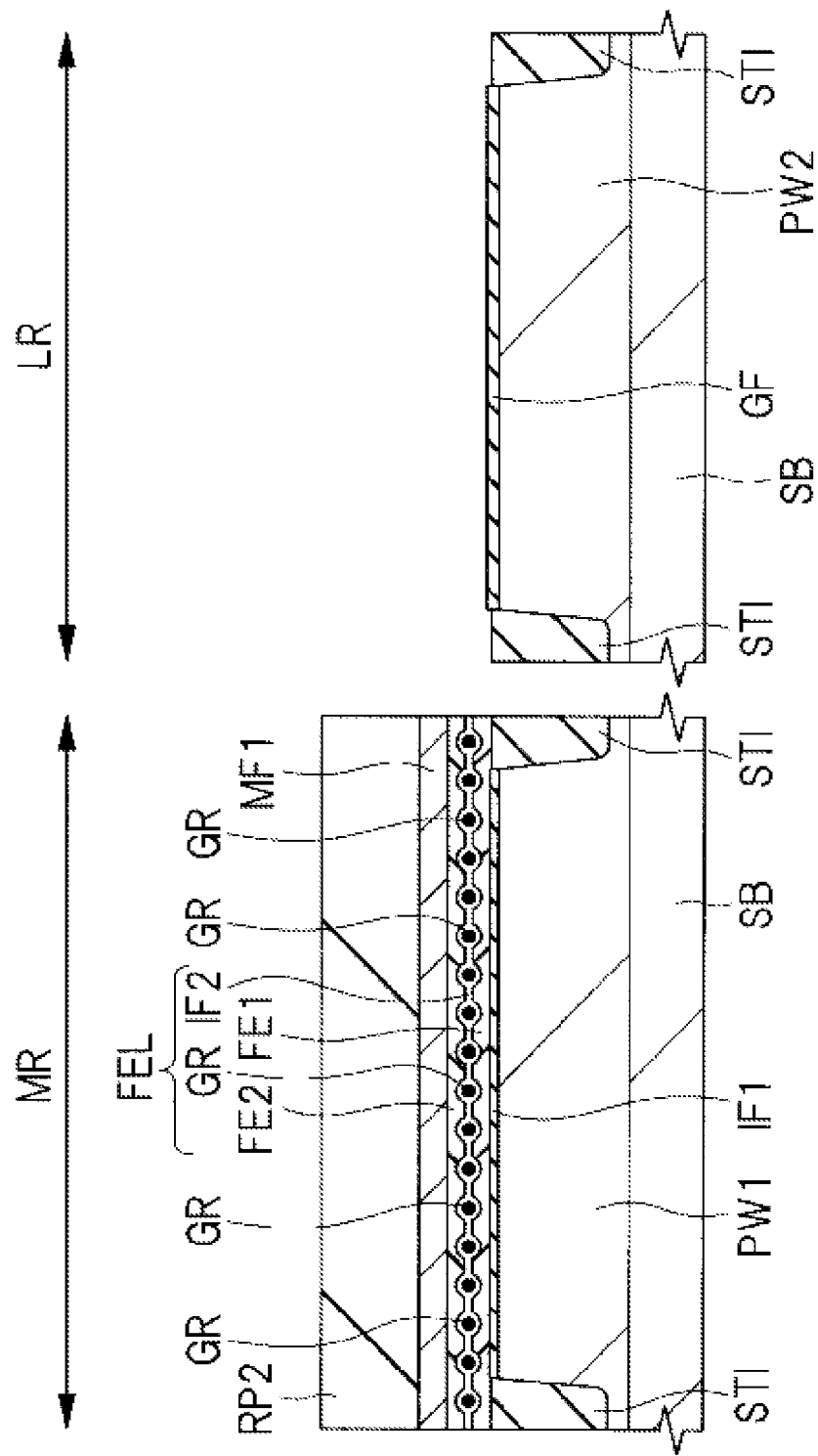
FIG. 13 shows a cross-sectional view showing the manufacturing process of semiconductor device in continuation to FIG. 12.

Next, as shown in FIG. 13, the region LR is opened and a resist pattern RP2 having a pattern covering the region MR is formed. Next, an etching process is performed using the resist pattern RP2 as a mask. In this manner, the metal film MF1 and the ferroelectric layer FEL formed in the region LR are removed so to leave the metal film MF1 and the ferroelectric layer FEL formed in the region MR.

Figure 14:
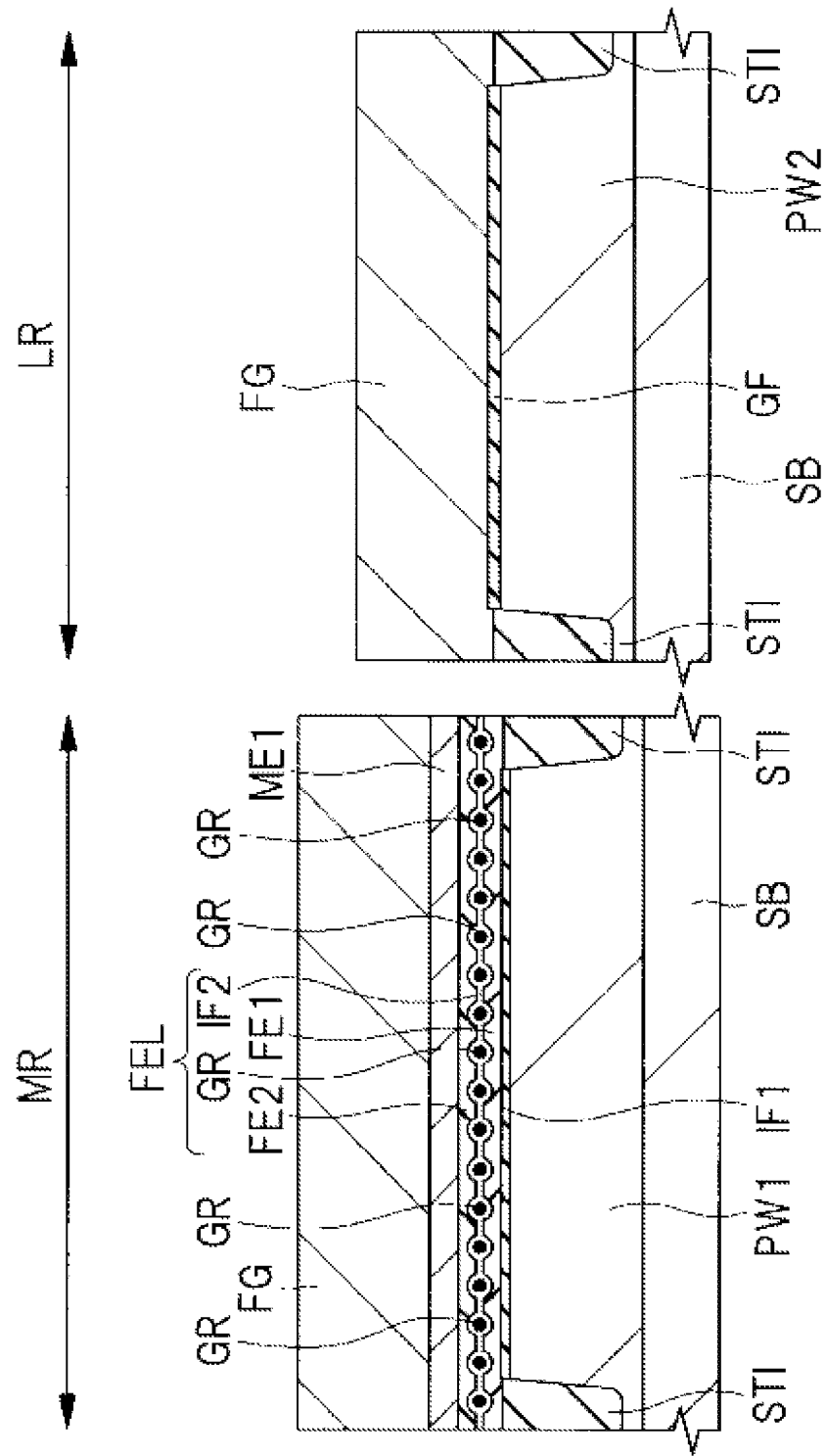
FIG. 14 shows a cross-sectional view showing the manufacturing process of semiconductor device in continuation to FIG. 13.

Next, as shown in FIG. 14, the resist pattern RP2 is removed by, for example, an ashing process. Thereafter, on the metal film MF1 in the region MR and on the gate insulating film GF in the region LR, a conductive film FG comprising a polycrystalline silicon to which n-type impurities are introduced is formed by, e.g., a CVD method.

As described above, the metal film MF1 may be removed prior to forming the conductive film FG, provided that the ferroelectric layer FEL can be sufficiently maintained as an orthorhombic crystal.

Figure 15:
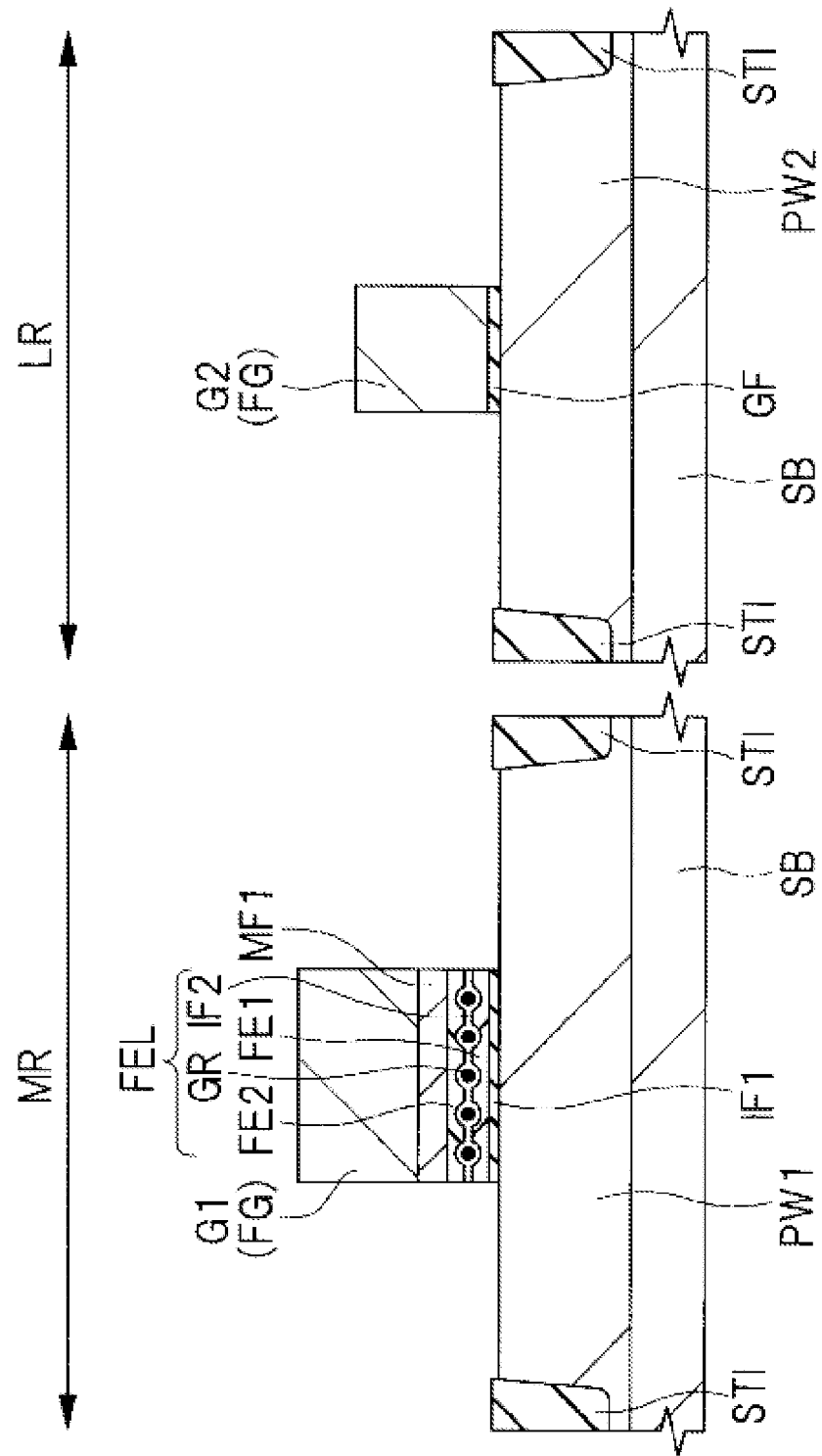
FIG. 15 shows a cross-sectional view showing the manufacturing process of semiconductor device in continuation to FIG. 14.

Next, as shown in FIG. 15, by a photolithography method and an etching process, the conductive film FG of the region MR and the region LR is patterned. Thus, in the region MR, the gate electrode G1 is formed, and in the region LR, the gate electrode G2 is formed. Subsequently, by performing an etching process, the metal film MF1, the ferroelectric layer FEL and the insulating film IF1 that are not covered with the gate electrode G1 are removed in the region MR. Further, by the etching process, in the region LR, the gate insulating film GF which is not covered with the gate electrode G2 is removed.

In the present embodiment, the metal film MF1 functions as a part of the gate electrode because, in the example, the metal film MF1 under the gate electrode G1 (under the conductive film FG) is left.

Figure 16:
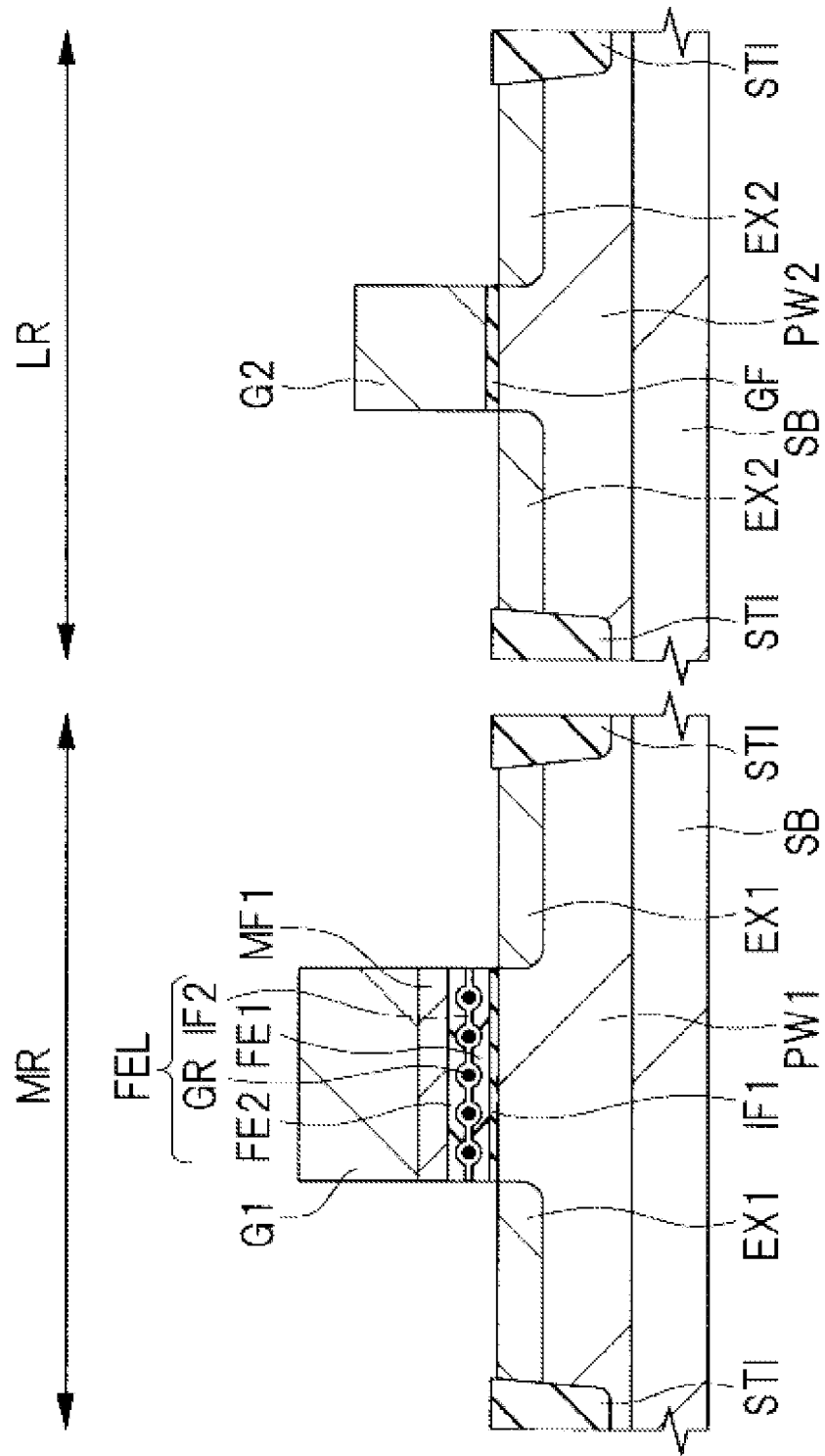
FIG. 16 shows a cross-sectional view showing the manufacturing process of semiconductor device in continuation to FIG. 15.

Next, as shown in FIG. 16, by a photolithography method and an ion implantation method, the extension regions EX1 which are n-type impurity regions are formed in the well region PW1 at a position matching the gate electrode G1 in the region MR and the extension regions EX2 which are n-type impurity regions are formed in the well region PW2 at a position matching the gate electrode G2 in the region LR. The extension regions EX1 constitute a part of a source region or a part of a drain region of the ferroelectric memory cell MC. The extension regions EX2 constitute a part of a source region or a part of a drain region of the MISFET 1Q.

Figure 17:
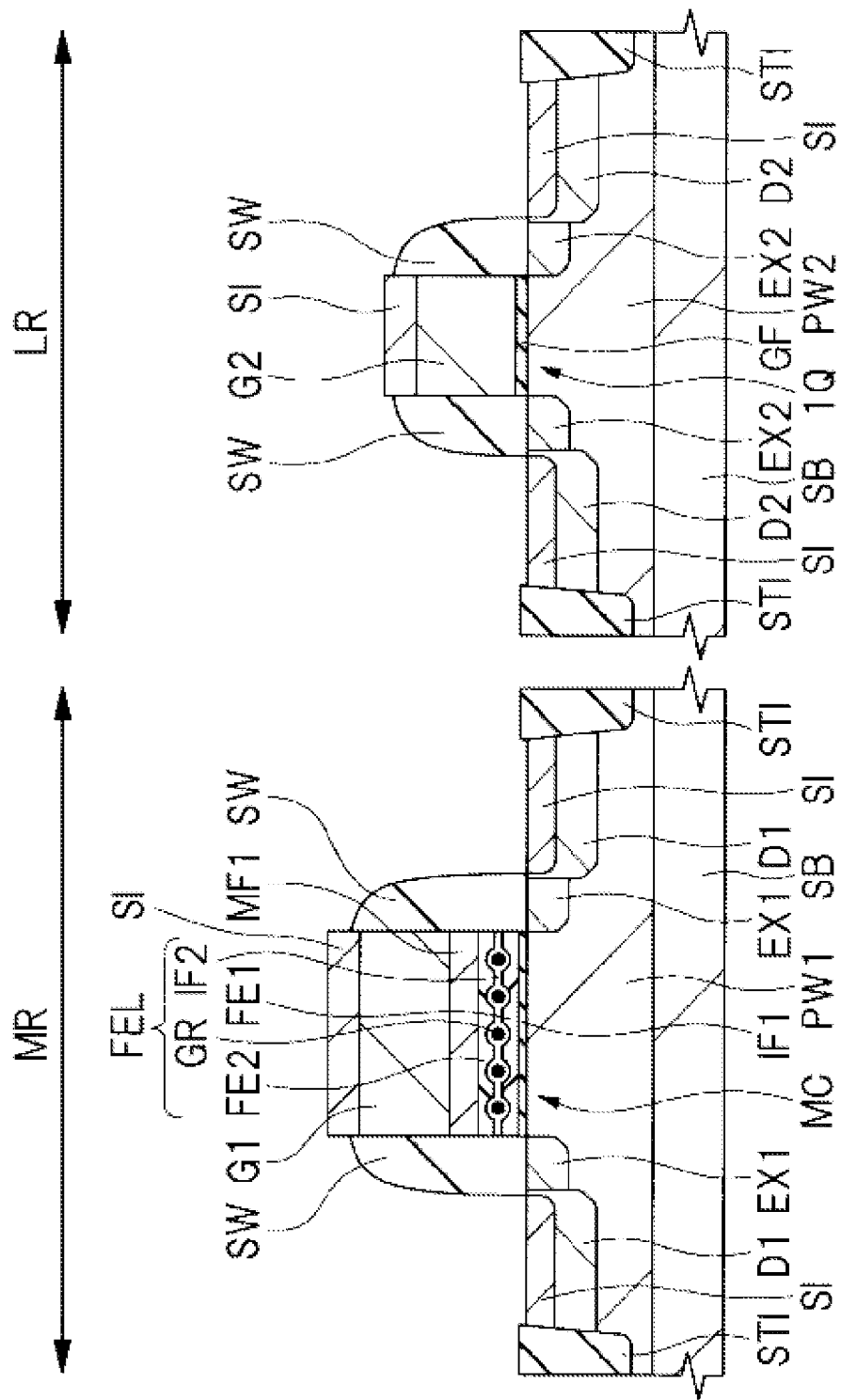
FIG. 17 shows a cross-sectional view showing the manufacturing process of semiconductor device in continuation to FIG. 16.

Next, as shown in FIG. 17, for example, a silicon oxide film and a silicon nitride film are sequentially formed by, e.g., a CVD method, so to cover the gate electrode G1 and the gate electrode G2. Then, by an anisotropic etching process, the silicon nitride film is processed. Thereafter, the silicon oxide film formed on upper surface of the gate electrode G1 and upper surface of the gate electrode G2 is removed. As a result, sidewall spacers SW comprising stacked films of a silicon oxide film and a silicon nitride film are formed on the side surfaces of the gate electrode G1 and on the side surfaces of the gate electrode G2.

Next, n-type impurities are introduced into the semiconductor substrate by a photolithography method and an ion implantation method. Thus, in the region MR, the diffusion regions D1 which are n-type impurity region are formed in the well region PW1 at a position matching the sidewall spacers SW. By introducing impurities by the ion implantation method, in the region LR, the diffusion regions D2 which are n-type impurity regions are formed in the well region PW2 at a position matching the sidewall spacers SW.

In the region MR, the diffusion regions D1 have an impurity concentration higher than that that of the extension regions EX1, are connected to the extension regions EX1, and form a part of the source region or a part of the drain region of the ferroelectric memory cell MC.

In the region LR, the diffusion regions D2 have an impurity concentration higher than that of the extension regions EX2, are connected to the extension regions EX2, and form a part of the source region or the drain region of the MISFET 1Q.

Next, the low-resistance silicide layer SI is formed on upper surface of each of the diffusion regions D1, the diffusion regions D2, the gate electrode G1, and the gate electrode G2 by a Salicide technique (Salicide: Self Aligned Silicide).

Specifically, the silicide layer SI can be formed as follows. First, a metal film for forming the silicide layer SI is formed so to cover the region MR and the region LR. The metal film comprises, for example, cobalt, nickel or nickel platinum alloy. Next, the semiconductor substrate SB is subjected to a first heat treatment at about 300 to 400° C., and thereafter, the unreacted metal film is removed. Thereafter, a second heat treatment is performed at about 500 to 700° C. As a result, the materials included in the diffusion regions D1, the diffusion regions D2, the gate electrode G1, and the gate electrode G2 react with the metal film. As a result, the silicide layer SI is formed on upper surface of each of the diffusion regions D1, the diffusion regions D2, the gate electrode G1, and the gate electrode G2. The silicide-layer SI comprises cobalt silicide ($CoSi_2$), nickel silicide (NiSi) or nickel platinum silicide (NiPtSi).

Alternatively, the material constituting the gate electrode G1 may be replaced with a metal film such as a titanium nitride film, an aluminum film, or a tungsten film, or a stacked film in which two or more of these metal films are stacked as appropriate. In this case, after the process of FIG. 17, the polycrystalline silicon film, which is the material of the gate electrode G1, can be replaced with the metal film or the stacked film by using a so-called gate-last process.

As described above, the ferroelectric memory cell MC having MFIS structure is formed in the region MR, and the MISFET 1Q is formed in the region LR. That is, the semiconductor device of the present embodiment is substantially completed.

Thereafter, the structure shown in FIG. 2 is obtained through the following processes.

First, an interlayer insulating film IL1 comprising, for example, silicon oxide, is formed by, for example, a CVD method so to cover the ferroelectric memory cell MC formed in the region MR and the MISFET 1Q formed in the region LR. Next, a plurality of contact holes are formed in the interlayer insulating film IL1 by using a photolithography method and an etching process. Then, in the plurality of contact holes, a barrier metal film, comprising, for example, a titanium film, a titanium nitride film, or a stacked film thereof is formed. Subsequently, a conductive film mainly formed of tungsten is formed on the barrier metal film. Next, a plug PG is formed in the contact hole by removing the barrier metal film and the conductive film outside the contact hole, for example, by a CMP method. The plug PG is electrically connected to the diffusion region D1 or the diffusion region D2 through the silicide layer SI. Although not shown in the figure, the plug PG electrically connected to the gate electrode G1 and the gate electrode G2 also exists.

Comparison Between Comparative Example and Present Embodiment

FIG. 21 shows a cross-sectional view of comparative example studied by the present inventor(s) during the manufacturing process of semiconductor device. FIG. 21 shows a cross-sectional view during the manufacturing process corresponding to FIG. 12 of the present embodiment. That is, FIG. 21 shows a state in which the heat treatment for crystallization is provided with respect to the amorphous film serving as the ferroelectric layer FEL and the ferroelectric film FE4 is formed.

In the comparative example, as in the present embodiment, a ferroelectric memory cell having the ferroelectric layer FEL is formed. Here, the ferroelectric layer FEL of the comparative example comprises a monolayer film of the ferroelectric film FE4, and does not comprise the stacked film of the ferroelectric film FE1 and the ferroelectric film FE2 as in the present embodiment, nor have the plurality of grains GR. The ferroelectric film FE4 comprises hafnium (Hf), oxygen (O), and zirconium (Zr) which is the first element.

For example, in the case of a hafnium oxide ($HfO_2$) film, an amorphous film is deposited by an ALD method or the like, and then a heat treatment is performed at a temperature higher than 900° C., whereby the crystal phase of $HfO_2$ film becomes monoclinic. Therefore, $HfO_2$ film becomes a paraelectric rather than a ferroelectric. Here, by adding the first element comprising zirconium (Zr) to $HfO_2$ film, the ferroelectric film FE4 is easily formed as an orthorhombic crystal. Further, by forming the metal film MF1 comprising titanium nitride or the like on the amorphous film, it is easy to control the orientation of the ferroelectric film FE4.

In the ferroelectric memory cell, by applying positive and negative voltages to the gate electrode, the threshold voltage is controlled by controlling the inversion of the polarization domain in the ferroelectric layer FEL. Therefore, the variation of the threshold voltage in the ferroelectric memory cell greatly depends on the variation of the crystal grain size and the variation of the crystal orientation of the ferroelectric film FE4. As the number of times of rewriting of the ferroelectric memory cell MC increases, the film quality in the ferroelectric layer FEL deteriorates. Therefore, the magnitude of the variation of the crystal grain size and of the variation in the crystal orientation greatly affects the variation of the threshold voltage.

According to the studies of the present inventor(s), it has been found that the variation in the crystal grain size and the variation in crystal orientation of the ferroelectric film FE4 cannot be sufficiently suppressed in the ferroelectric memory cell of the comparative example. For this reason, in the comparative example, as the number of times of rewriting of the ferroelectric memory cell MC increases, the variation of the threshold voltage increases. Further, in the ferroelectric memory cell of the comparative example, the threshold voltage distribution in the write state and the threshold voltage distribution in the erase state overlap with each other, and thus, the memory window is narrow. That is, in the case of the comparative example, there are problems that erroneous writing and erroneous erasing tend to occur.

Therefore, the present inventor(s) have investigated, upon forming the ferroelectric layer, adopting a stacked structure comprising two amorphous films and further providing a plurality of grains comprising a second element (for example, aluminum) between the amorphous films. However, the grains do not comprise the above-mentioned third element. By providing the plurality of grains, it is possible to suppress the variation in the crystal grain size and crystal orientation of the ferroelectric layer. However, if only the plurality of grains are formed, there is a possibility that the polarization characteristics at the time of operation may vary among the ferroelectric memory cells.

In contrast, in the present embodiment, when forming the ferroelectric layer FEL, it employs a stacked structure of the amorphous film AM1 and the amorphous film AM2. Further, here, the plurality of grains GR each comprising the second element and the third element is provided between the amorphous film AM1 and the amorphous film AM2. The radius of each crystal grain size of the plurality of grains GR is precisely controlled, for example, in the range of 0.1 nm to 1 nm. Then, by performing the heat treatment for crystallization with respect to the amorphous film AM1, the amorphous film AM2 and a plurality of grains GR while the metal film MF1 is formed on the amorphous film AM2, the crystal grain size of each of the ferroelectric film FE1 and the ferroelectric film FE2 is aligned according to the crystal grain size of the plurality of grains GR.

Therefore, as compared with the case of forming an aluminum grain which does not comprise the third element as the plurality of grains between the amorphous film AM1 and the amorphous film AM2, the uniformity of the crystal grain size in the ferroelectric layer FEL is improved. Thus, in the ferroelectric layer FEL, by improving the uniformity of the crystal grain size, it is possible to align the crystal orientation to an orthorhombic crystal of (001) orientation. That is, it increases the reliability of the ferroelectric layer FEL.

Figure 20:
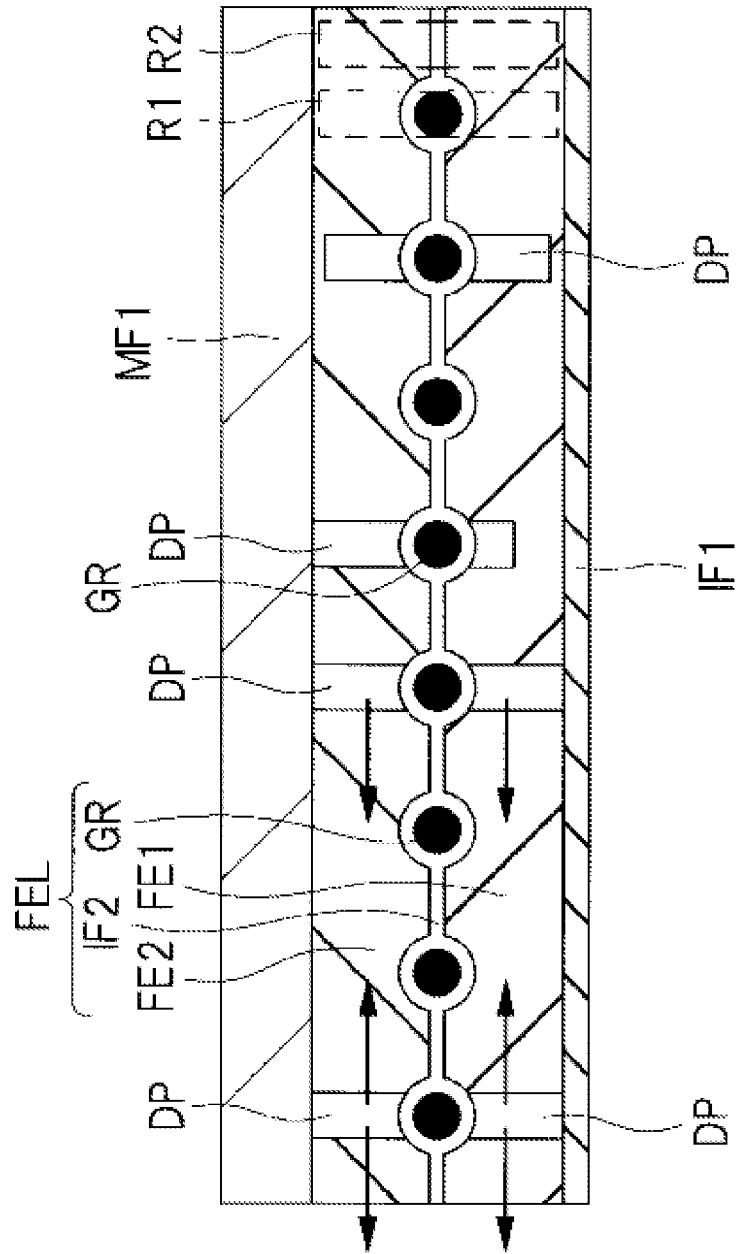
FIG. 20 shows an enlarged cross-sectional view of main portion of the first embodiment.

Here, FIG. 20 shows an enlarged cross-sectional view of the main portion of the ferroelectric memory cell, which is the semiconductor device of the present embodiment. FIG. 20 shows a stacked film comprising the insulating films IF1, IF2, the plurality of grains GR, the ferroelectric film FE1, the ferroelectric film FE2 and the metal film MF1 constituting a ferroelectric memory cell. When operating the ferroelectric memory cell and polarizing the ferroelectric layer FEL, the polarization within the ferroelectric layer FEL begins with each of the plurality of grains GR that are crystal nuclei and from a region DP that overlaps the plurality of grains GR in plan view. This is because the dielectric constant of the plurality of grains GR is higher than that of the portion where the plurality of grains GR does not exist. Thereafter, the polarized regions in the ferroelectric layer FEL expand laterally from the region DP extending longitudinally between the ferroelectric film FE1 and the ferroelectric film FE2.

In the present embodiment, an insulating film IF2 comprising the material (the one comprising the third element) having the dielectric constant lower than any of that of the plurality of grains GR, the ferroelectric film FE1 and the ferroelectric film FE2 is formed between the grains GR adjacent to each other. Therefore, the difference in dielectric constant between the region R1 in which the plurality of grains GR exist and the region R2 in which the plurality of grains GR do not exist is larger than the difference in dielectric constant when the insulating film IF2 is not formed. That is, the dielectric constant of the region R1 comprising the ferroelectric film FE1, the insulating film IF2, the grains GR and the ferroelectric film FE2 stacked in the longitudinal direction is higher than the dielectric constant of the region R2 comprising the ferroelectric film FE1, the insulating film IF2 and the ferroelectric FE2 stacked in the longitudinal direction. Therefore, upon the operation of the ferroelectric memory cell, polarization is easily started from the region R1 (DP) comprising each of the plurality of grains GR.

That is, as compared with the case where the insulating film IF2 does not exist, the formation density of the portion where the polarization starts is more uniform. Thus, it is possible to suppress the occurrence of variations in the threshold voltage of the ferroelectric memory cell. It is possible to improve the rewrite resistance of the ferroelectric memory cell and suppress deterioration of retention characteristics.

The insulating film IF2 is formed in order to reduce the dielectric constant of the region R2 between the plurality of grains GR adjacent to each other. Therefore, it is sufficient that the plurality of grains GR which are Al—Si clusters are formed as the crystal nuclei for crystal growth, and that the insulating film IF2 is formed between the plurality of grains GR adjacent to each other. That is, each of the plurality of grains GR may not be covered with the insulating film IF2.

Here, the areal density of the plurality of grains GR1 and the plurality of grains GR is set within $1\times10^{13}/cm^2 \sim 1\times10^{15}/cm^2$. Thus, the crystal grain size of each of the ferroelectric film FE1 and the ferroelectric film FE2 is aligned, for example, in the range of 5 to 50 nm. Thus, since the variation in the polarization characteristics of the ferroelectric layer FEL is suppressed, it is possible to suppress the variation in the threshold voltage of the ferroelectric memory cell MC.

Thus, in the present embodiment, the distribution of the threshold voltage of the write state and the distribution of the threshold voltage of the erase state are prevented from overlapping each other. That is, the memory window is expanded. That is, the occurrence of erroneous writing or erroneous erasing when a ferroelectric memory cell is used can be prevented.

Further, in the ferroelectric memory cell equipped with the ferroelectric layer, the heat resistance of the ferroelectric layer is low and hence the crystallization of semiconductor device becomes unstable at a high temperature in the manufacturing process, hence causing a problem that the reliability of semiconductor device is lowered. In contrast, in the present embodiment, by providing the plurality of grains GR, the uniformity of the crystal grain size is improved and it is easy to align the crystal orientation in an orthorhombic crystal of (001) orientation. That is, when the ferroelectric film FE1 and the ferroelectric film FE2 are at a high temperature due to a heat treatment or the like, it is possible to increase the threshold temperature where the crystal phase of these films is likely to be monoclinic. In other words, it increases the heat resistance of the ferroelectric layer FEL of a semiconductor device during and after the manufacturing process. For this reason, in the present embodiment, the upper limit of the heat treatment performed for crystallizing the amorphous film AM1 and the amorphous film AM2 can be raised not to about 700° C., but, for example, to 900° C. Thereby, a stable crystallization in the heat treatment process can be realized. Therefore, the reliability and yield of semiconductor device are improved.

In the present embodiment, when the ferroelectric layer FEL comprising the ferroelectric film FE1, the ferroelectric film FE2 and the plurality of grains GR is applied to the ferroelectric memory cell MC, the increase of the variation of the threshold voltage as described above can be suppressed. Therefore, it is possible to suppress a problem that the rewrite durability of the ferroelectric memory cell MC is lowered and a problem that the retention is lowered. In other words, a technique of the present embodiment can improve the performance of semiconductor device.

Second Embodiment

A semiconductor device of the second embodiment will be described below with reference to FIGS. 18 and 19. In the following explanation, differences from the first embodiment will be mainly explained.

In the first embodiment, a ferroelectric memory cell MC with a MFIS structure is exemplified, while in the second embodiment, a memory cell called MFMIS (Metal Ferroelectric Metal Insulator Semiconductor) structure in which a ferroelectric layer FEL is applied to a transistor structure is exemplified as a ferroelectric memory cell MC.

In the manufacturing process of semiconductor device of the present embodiment, first, the same processes as described with reference to FIGS. 4 to 6 are performed.

Figure 18:
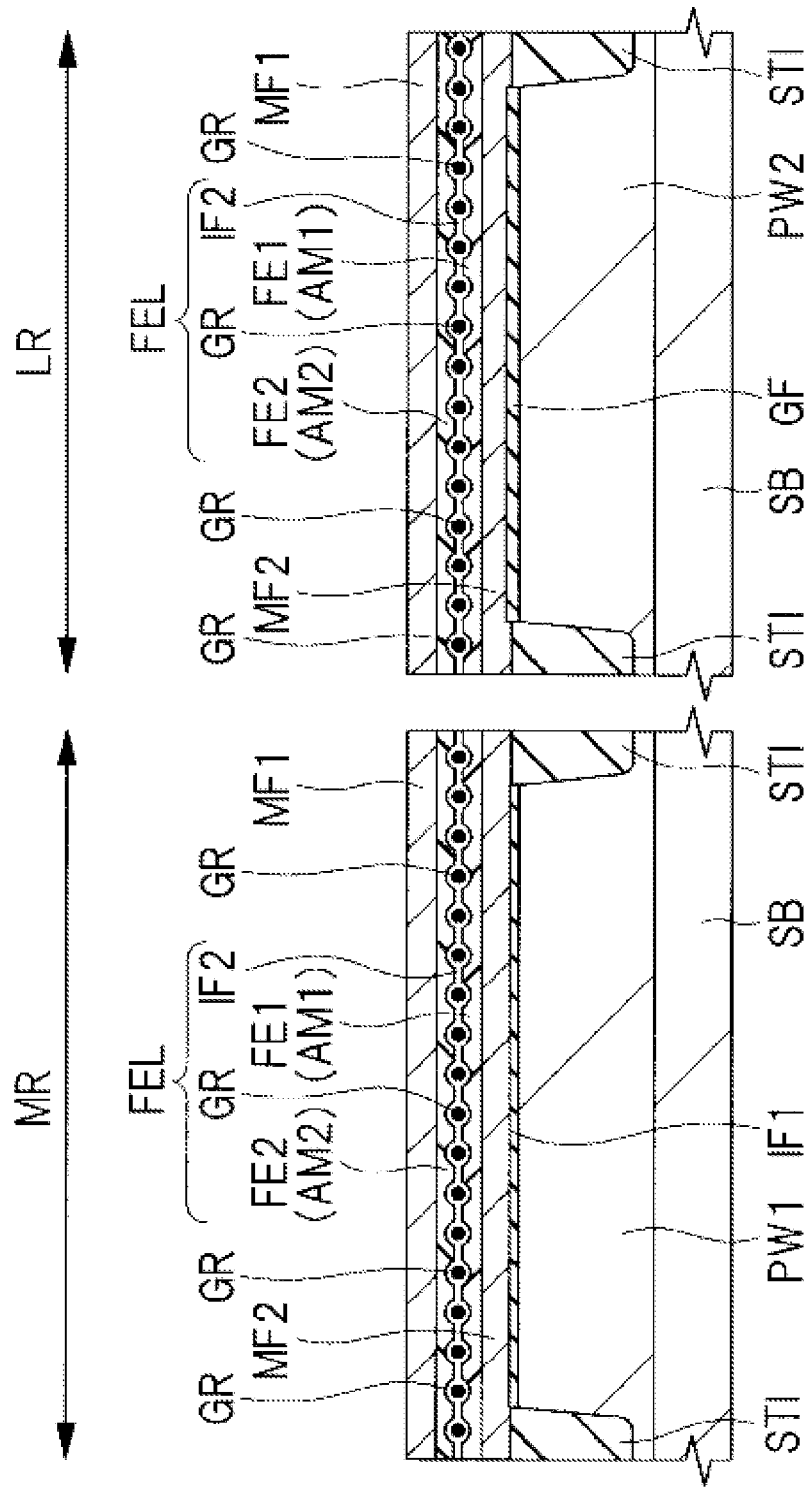
FIG. 18 shows a cross-sectional view showing the manufacturing process of semiconductor device according to the second embodiment.

Next, as shown in FIG. 18, a metal film MF2 is formed on the insulating film IF1 in the region MR and on the gate insulating film GF in the region LR. Subsequently, an amorphous film AM1 is formed on the metal film MF2 in the region MR and the region LR in the same manner as in the manufacturing method described with reference to FIG. 7. The metal film MF2 comprises the same materials as those of the metal film MF1, and can be formed by the same manufacturing method as that of the metal film MF1. Subsequently, the same processes as described with reference to FIGS. 8 to 12 are performed. The structure shown in FIG. 18 is obtained accordingly.

Figure 19:
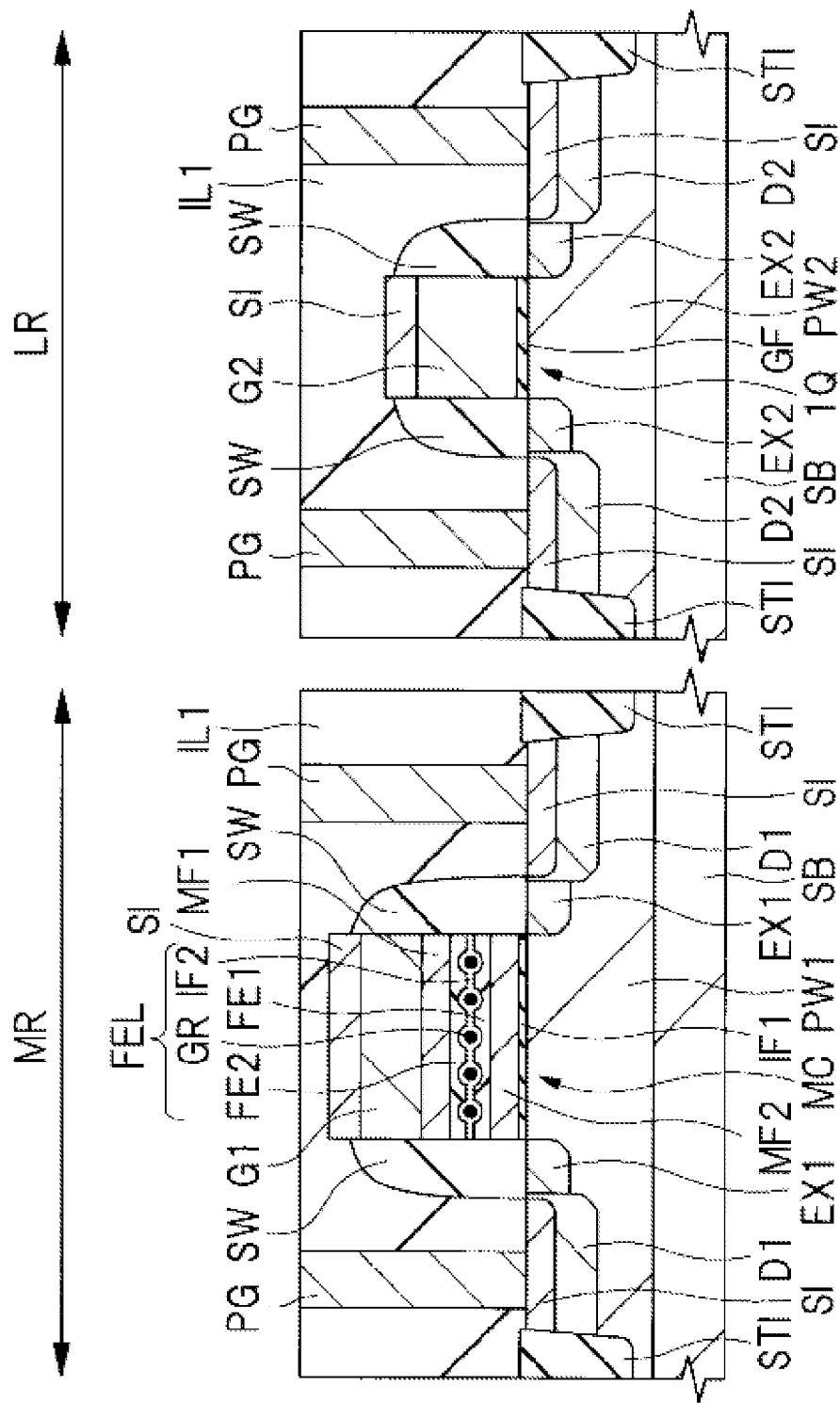
FIG. 19 shows a cross-sectional view showing the manufacturing process of semiconductor device in continuation to FIG. 18.

Next, as shown in FIG. 19, the same processes as described with reference to FIGS. 13 to 17 and FIG. 2 are performed. Thus, the semiconductor device of the present embodiment shown in FIG. 19 is substantially completed.

The metal film MF2 has the same function as the metal film MF1. That is, the metal film MF2, when crystallizing the amorphous film AM1 and the amorphous film AM2, has a function of orienting the crystal phase of each of the ferroelectric film FE1 and the ferroelectric film FE2 in an orthorhombic. Therefore, the orientation of each of the ferroelectric film FE1 and the ferroelectric film FE2 is controlled not only by the stress from the metal film MF1 but also by the stress from the metal film MF2.

Therefore, in the present embodiment, as compared with the first embodiment, the stress controlling the crystal phase of each of the ferroelectric film FE1 and the ferroelectric film FE2 is higher. Therefore, it is possible to make each of the ferroelectric film FE1 and the ferroelectric film FE2 as an orthorhombic crystal with a greater assurance.

Although the invention made by the inventor(s) of the present application has been specifically described based on the embodiments, the present invention is not limited to the embodiments described above, and various modifications can be made without departing from the gist thereof.

For example, the ferroelectric layer of the first embodiment may have an MFM structure and can also be applied to a capacitor-type memory which is formed between interconnects. A stacked film of the MFM structure comprises, for example, a titanium nitride (TiN) film, a HfZrO film (ferroelectric layer) and a titanium nitride (TiN) film which are sequentially formed on the interlayer insulating film in the interconnection layer. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

What is claimed is:

1. A method for manufacturing a semiconductor device, the method comprising:
   (a) forming a first amorphous film comprising hafnium, oxygen and a first element;
   (b) forming a plurality of first grains comprising a second element different from any of hafnium, oxygen, and the first element on the first amorphous film;
   (c) after the (b), forming an insulating film comprising a third element different from any of hafnium, oxygen, the first element and the second element on the first amorphous film;
   (d) forming a second amorphous film comprising hafnium, oxygen, and the first element on the insulating film;
   (e) forming a first metal film on the second amorphous film; and
   (f) after the (e), performing a heat treatment to crystallize the first amorphous film to form a first ferroelectric film that is orthorhombic and to crystallize the second amorphous film to form a second ferroelectric film that is orthorhombic.

2. The method according to claim 1, wherein,
   in the (b), the plurality of first grains are formed separately from each other; and
   in the (f), the plurality of first grains function as crystal nuclei of the first ferroelectric film and the second ferroelectric film.

3. The method according to claim 2, wherein,
   in the (c), by forming the insulating film, the plurality of first grains react with the third element to form a plurality of second grains comprising the second element and the third element, and in the (f), the plurality of second grains function as crystal nuclei.

4. The method according to claim 2, wherein, in the (f), an orientation of each of the first ferroelectric film and the second ferroelectric film is controlled by stress from the first metal film.

5. The method according to claim 1, wherein the (b) is performed by a sputtering method.

6. The method according to claim 5, wherein, in the (c), the insulating film is formed by depositing the insulating film by ALD method for 1 to 4 cycles at temperatures of 100° C. or higher.

7. The method according to claim 1, wherein the second element is aluminum.

8. The method according to claim 1, wherein, in the (b), an areal density of the plurality of first grains with respect to upper surface of the first amorphous film is in a range of $1\times10^{13}/cm^2 \sim 1\times10^{15}/cm^2$.

9. The method according to claim 1, wherein, in the (f), the heat treatment is performed using a microwave, and the electric field of the microwave is vibrated in longitudinal direction to upper surface of the first metal film.

* * * * *